(12) United States Patent
Otsuji

(10) Patent No.: US 12,159,783 B2
(45) Date of Patent: Dec. 3, 2024

(54) METHOD OF RESTORING COLLAPSED PATTERN, SUBSTRATE PROCESSING METHOD, AND SUBSTRATE PROCESSING DEVICE

(71) Applicant: SCREEN Holdings Co., Ltd., Kyoto (JP)

(72) Inventor: Masayuki Otsuji, Kyoto (JP)

(73) Assignee: SCREEN Holdings Co., Ltd. (JP)

( * ) Notice: Subject to any disclaimer, the term of this patent is extended or adjusted under 35 U.S.C. 154(b) by 0 days.

(21) Appl. No.: 17/734,186

(22) Filed: May 2, 2022

(65) Prior Publication Data

US 2022/0262622 A1 Aug. 18, 2022

Related U.S. Application Data

(62) Division of application No. 16/319,642, filed as application No. PCT/JP2017/031629 on Sep. 1, 2017, now Pat. No. 11,373,860.

(30) Foreign Application Priority Data

Sep. 16, 2016 (JP) .................................. 2016-182122

(51) Int. Cl.
*H01L 21/02* (2006.01)
*H01L 21/67* (2006.01)

(52) U.S. Cl.
CPC .. *H01L 21/02057* (2013.01); *H01L 21/67023* (2013.01)

(58) Field of Classification Search
CPC ......... H01L 21/02057; H01L 21/67023; H01L 21/67028; H01L 21/67103; H01L 21/68742; H01L 21/67051; H01L 21/304
See application file for complete search history.

(56) References Cited

U.S. PATENT DOCUMENTS

| 5,326,672 A | 7/1994 | Tanaka et al. ................ 430/322 |
| 7,270,941 B2 * | 9/2007 | Toma ................... H01L 21/316 |
| | | 257/E21.271 |

(Continued)

FOREIGN PATENT DOCUMENTS

| GB | 2336845 A * 11/1999 ............ C08F 222/06 |
| JP | H05-315241 A 11/1993 |

(Continued)

OTHER PUBLICATIONS

Second and Supplementary Notice Informing the Application to the Application of the International Application (to Designated Offices which Apply the 30 month time limit under Article 22(1)) (Form PCT/IB/308) in corresponding PCT International Application No. PCT/JP2017/031629 dated Jan. 17, 2019.

(Continued)

*Primary Examiner* — Mohammed Shamsuzzaman
(74) *Attorney, Agent, or Firm* — OSTROLENK FABER LLP

(57) ABSTRACT

The collapsed pattern recovering method is a method for recovering a collapsed pattern which is a pattern formed on a front surface of a substrate, and the method includes a reactive gas supplying step which supplies to the front surface of the substrate a reactive gas that can react with a product existing on the front surface. The reactive gas supplying step includes a hydrogen fluoride vapor supplying step which supplies vapor that contains hydrogen fluoride to the front surface of the substrate. The collapsed pattern recovering method further includes a substrate heating step which heats the substrate in parallel with the hydrogen fluoride vapor supplying step.

2 Claims, 16 Drawing Sheets

(56) References Cited

U.S. PATENT DOCUMENTS

| | | | | |
|---|---|---|---|---|
| 8,450,164 | B2* | 5/2013 | Bhat | H01L 28/91 |
| | | | | 438/190 |
| 9,263,649 | B2* | 2/2016 | Koike | G03F 7/0002 |
| 9,799,538 | B2* | 10/2017 | Kaneko | H01L 21/67051 |
| 10,403,491 | B2* | 9/2019 | Mizutani | H01L 21/02071 |
| 2002/0072116 | A1* | 6/2002 | Bhatia | C12M 29/10 |
| | | | | 435/366 |
| 2004/0180147 | A1* | 9/2004 | Parikh | A61K 9/127 |
| | | | | 427/282 |
| 2004/0226654 | A1 | 11/2004 | Hongo et al. | 156/345.11 |
| 2005/0161720 | A1* | 7/2005 | Park | H01L 28/91 |
| | | | | 257/296 |
| 2006/0081273 | A1* | 4/2006 | McDermott | B08B 7/0021 |
| | | | | 134/34 |
| 2006/0194404 | A1 | 8/2006 | Dupont et al. | 438/397 |
| 2006/0211163 | A1* | 9/2006 | Ouellet | B81C 1/00936 |
| | | | | 257/E21.252 |
| 2007/0122752 | A1* | 5/2007 | Asako | H01L 21/76814 |
| | | | | 430/313 |
| 2008/0190454 | A1 | 8/2008 | Eitoku | 134/19 |
| 2008/0233280 | A1* | 9/2008 | Blanchet | B82Y 10/00 |
| | | | | 428/44 |
| 2009/0192065 | A1 | 7/2009 | Korzenski et al. | 510/176 |
| 2009/0311874 | A1 | 12/2009 | Tomita et al. | 438/759 |
| 2010/0075504 | A1 | 3/2010 | Tomita et al. | 438/706 |
| 2010/0240219 | A1 | 9/2010 | Tomita et al. | 438/706 |
| 2011/0120650 | A1* | 5/2011 | Asako | H01L 21/67109 |
| | | | | 156/345.27 |
| 2011/0174337 | A1* | 7/2011 | Nishimura | H01L 21/02057 |
| | | | | 134/105 |
| 2011/0183522 | A1* | 7/2011 | Mikhaylichenko | |
| | | | | H01L 21/02068 |
| | | | | 257/E21.228 |
| 2012/0045581 | A1 | 2/2012 | Kimura et al. | 427/248.1 |
| 2012/0205345 | A1* | 8/2012 | Ohto | H01L 21/31111 |
| | | | | 216/101 |
| 2012/0214722 | A1* | 8/2012 | Ohto | H01L 21/31111 |
| | | | | 564/291 |
| 2012/0272999 | A1 | 11/2012 | Kumon et al. | 134/4 |
| 2012/0325920 | A1 | 12/2012 | Ozaki et al. | 237/67 |
| 2013/0081301 | A1* | 4/2013 | Gouk | H10B 41/30 |
| | | | | 34/523 |
| 2013/0084707 | A1* | 4/2013 | Hashimoto | H01J 37/32724 |
| | | | | 438/710 |
| 2013/0165365 | A1* | 6/2013 | Matsunaga | C11D 7/3209 |
| | | | | 216/99 |
| 2014/0256155 | A1* | 9/2014 | Ting | G03F 7/423 |
| | | | | 438/778 |
| 2015/0060407 | A1* | 3/2015 | Negoro | B08B 3/02 |
| | | | | 156/345.23 |
| 2015/0323871 | A1* | 11/2015 | Klipp | H01L 21/0273 |
| | | | | 510/176 |
| 2015/0355546 | A1* | 12/2015 | Seko | C08L 83/04 |
| | | | | 524/588 |
| 2016/0086845 | A1* | 3/2016 | Sakai | H01L 21/67051 |
| | | | | 438/700 |
| 2016/0141170 | A1* | 5/2016 | Sato | H01L 21/67253 |
| | | | | 134/57 R |
| 2017/0110336 | A1* | 4/2017 | Hsu | H01L 21/31144 |
| 2017/0125240 | A1* | 5/2017 | Takahashi | H01L 21/02057 |
| 2018/0061631 | A1* | 3/2018 | Hinode | H01L 21/68764 |
| 2018/0076018 | A1* | 3/2018 | Otsuji | B08B 3/08 |
| 2018/0076022 | A1* | 3/2018 | Choi | H01L 21/02019 |
| 2018/0127709 | A1* | 5/2018 | Mukhopadhyay | C23C 16/56 |
| 2018/0197756 | A1* | 7/2018 | Hashizume | H01L 21/02057 |
| 2021/0193456 | A1* | 6/2021 | Dictus | B08B 9/0813 |

FOREIGN PATENT DOCUMENTS

| | | | |
|---|---|---|---|
| JP | 2001-276758 A | 10/2001 | |
| JP | 2003-045842 A | 2/2003 | |
| JP | 2003-188137 A | 7/2003 | |
| JP | 2005-175037 A | 6/2005 | |
| JP | 2006-237620 A | 9/2006 | |
| JP | 2007-227764 A | 9/2007 | |
| JP | 2010-225936 A | 10/2010 | |
| JP | 2011-071169 A | 4/2011 | |
| JP | 2011-151114 A | 8/2011 | |
| JP | 102376540 A | 3/2012 | |
| JP | 2012-238844 A | 12/2012 | |
| JP | 2013021208 A * | 1/2013 | ....... H01L 21/02057 |
| JP | 5412218 B2 | 2/2014 | |
| JP | 2016-143873 A | 8/2016 | |
| KR | 10-2008-0023346 A | 3/2008 | |
| TW | 201017736 A1 | 5/2010 | |
| WO | WO 2011/161797 A1 | 12/2011 | |

OTHER PUBLICATIONS

International Preliminary Report on Patentability (Chapter I) mailed Mar. 28, 2019 with a Notification from the International Bureau (Form PCT/IB/326) in corresponding PCT International Application No. PCT/JP2017/031629 in Japanese.

English translation of the International Preliminary Report on Patentability (Chapter I) mailed Mar. 28, 2019 with a Notification from the International Bureau (Form PCT/IB/338) in corresponding PCT International Application No. PCT/JP2017/316296.

International Search Report mailed Oct. 3, 2017 in corresponding PCT International Application No. PCT/JP2017/031629.

Written Opinion mailed Oct. 3, 2017 in corresponding PCT International Application No. PCT/JP2017/031629.

* cited by examiner

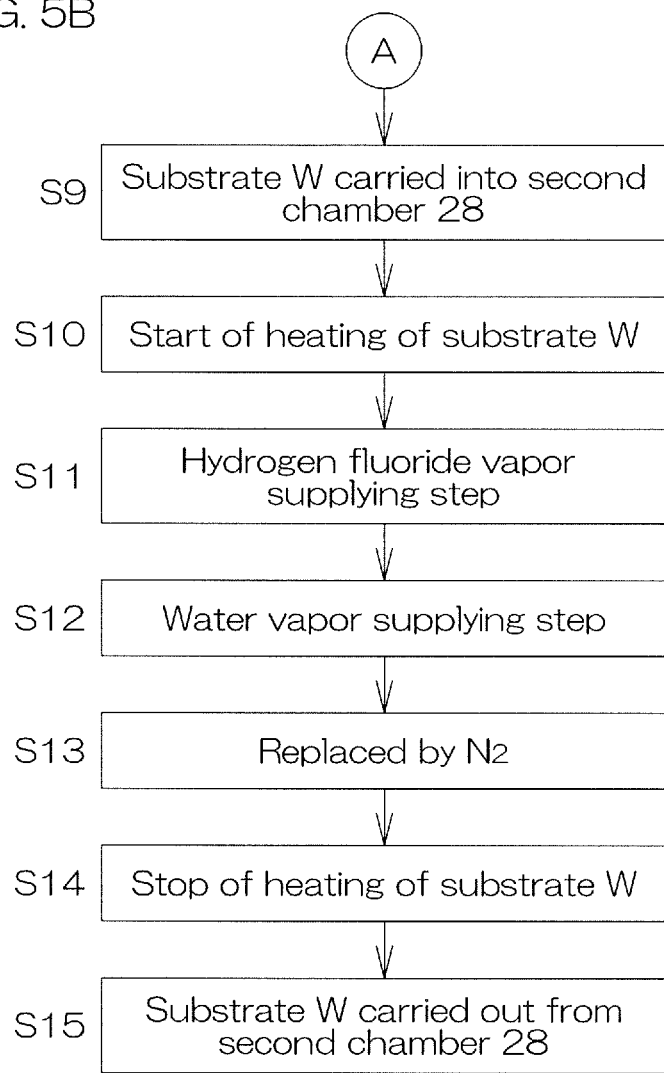

FIG. 13

First recovery test

|  | Conditions | Normalized recovery rate (%) |
|---|---|---|
| Example 1 | HF atmos 1min on 130°C | 81.1 |
| Example 2 | HF atmos 2min on 120°C | 92.6 (Best) |

FIG. 14A Before
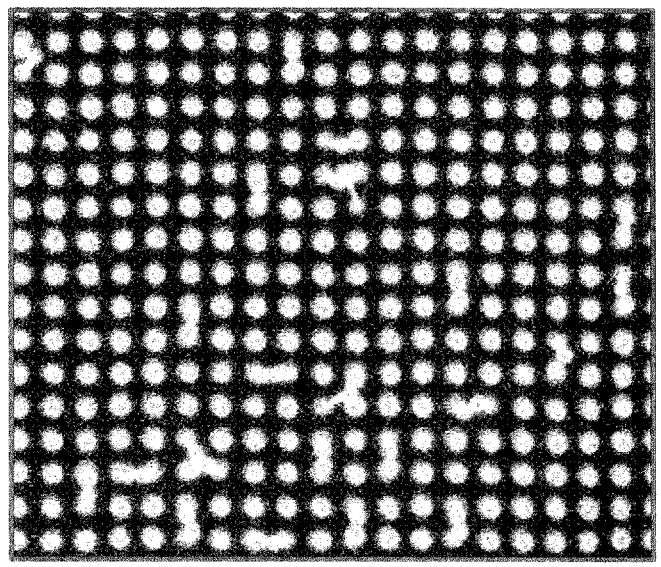
FIG. 14B After
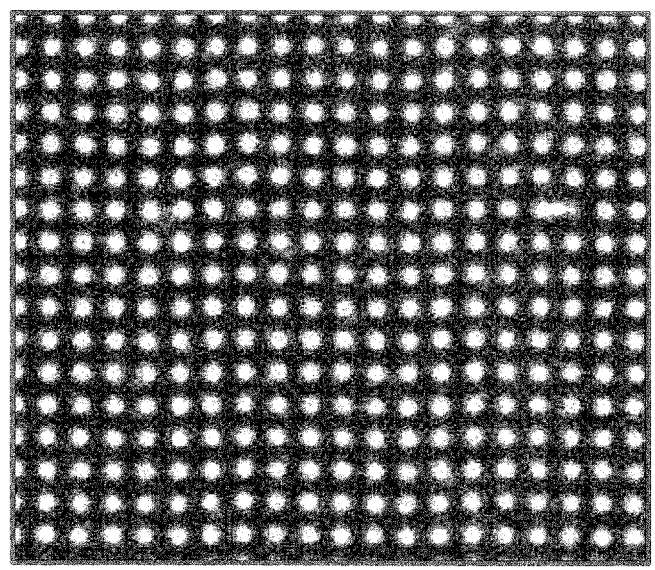

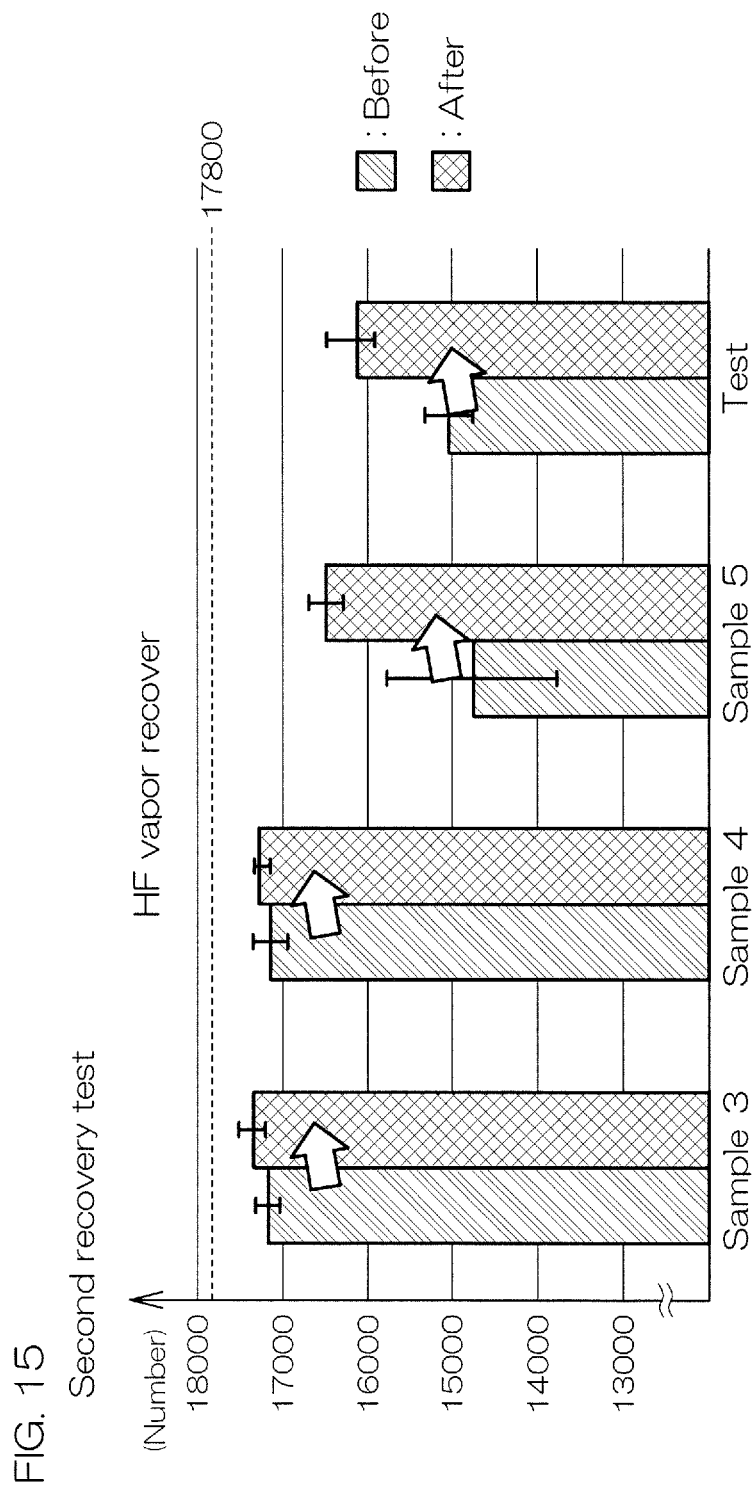

METHOD OF RESTORING COLLAPSED PATTERN, SUBSTRATE PROCESSING METHOD, AND SUBSTRATE PROCESSING DEVICE

CROSS REFERENCE TO RELATED APPLICATIONS

This is a divisional of U.S. patent application Ser. No. 16/319,642, filed Jan. 22, 2019, which is a 35 U.S.C. § 371 national phase conversion of PCT/JP2017/031629, filed Sep. 1, 2017, which claims priority to Japanese Patent Application No. 2016-182122, filed Sep. 16, 2016. Applicant claims priority to each of the foregoing patent applications. The PCT International Application was published in the Japanese language.

TECHNICAL FIELD

The present invention relates to a collapsed pattern recovering method, a substrate processing method and a substrate processing apparatus. Substrates to be processed include, for example, semiconductor wafers, substrates for liquid crystal displays, substrates for plasma displays, substrates for FEDs (Field Emission Displays), substrates for optical disks, substrate for magnetic disks, substrates for magneto-optical disks, substrates for photomasks, ceramic substrates, substrates for solar cells, etc.

BACKGROUND ART

In a manufacturing process for semiconductor apparatuses, front surfaces of substrates such as semiconductor wafers are processed by using a processing liquid such as a chemical liquid and a rinse liquid.

A single substrate processing type substrate processing apparatus that processes substrates one at a time includes, for example, a spin chuck that rotates the substrate while holding the substrate substantially horizontally, and a nozzle that supplies a processing liquid to an upper surface of the substrate rotated by the spin chuck.

In a typical substrate processing step, a chemical liquid is supplied to a substrate held by a spin chuck and, thereafter, a rinse liquid is supplied, by which the chemical liquid on the substrate is replaced by the rinse liquid. A generally-used rinse liquid is deionizer water.

Thereafter, a drying step is executed in order to remove the rinse liquid on the substrate. As the drying step, there is known a spin drying step in which the substrate is rotated at a high speed and dried by spinning off the liquid.

However, patterns such as a convex pattern and a linear pattern formed on a front surface of the substrate may collapse due to surface tension of the rinse liquid, etc., in the drying step.

CITATION LIST

Patent Literature

Patent Literature 1: US Unexamined Patent Application No. US2008/190454 A1

SUMMARY OF INVENTION

Technical Problem

The inventor of the present application and others have studied that a pattern which has collapsed in a spin drying step is able to be recovered after the collapse.

Thus, an object of the present invention is to provide a collapsed pattern recovering method that is capable of recovering a collapsed pattern, a substrate processing method and a substrate processing apparatus.

Solution to Problem

The present invention provides a method for recovering a collapsed pattern which is a pattern formed on a front surface of a substrate, and the collapsed pattern recovering method which includes a reactive gas supplying step which supplies to the front surface of the substrate a reactive gas that can react with a product existing on the front surface.

The inventor of the present application has found the following, that is, where a collapse occurs in a pattern having elasticity, the collapsed pattern acts to some extent on the force to rise up (recover) due to the elasticity of the pattern itself.

However, in reality, a collapsed state is retained even though the pattern has elasticity. The inventor of the present application considers that, as one of the factors that retains the collapsed state, adjacent patterns are collapsed, leading end portions thereof come into contact with each other, and the leading end portions in contact with each other are adhered by a product generated in association with substrate processing.

In this method, a reactive gas that can react with a product existing on the front surface is supplied to a front surface of the substrate. Where the leading end portions of the collapsed patterns are adhered to each other by the product, the reactive gas supplied to the front surface of the substrate reacts with the product (hereinafter, referred to as "adhered product") which adheres the leading end portions of the collapsed patterns together, and the adhered product is decomposed by the reaction. Thereby, it is possible to remove the adhered product from the leading end portion of the pattern.

By removing the adhered product from the leading end portion of the pattern, a force of the pattern will rise up (recover) due to the elasticity of the pattern itself acting on the collapsed pattern. It is, thereby, possible to recover the collapsed pattern.

In a preferred embodiment of the present invention, the reactive gas supplying step includes a hydrogen fluoride vapor supplying step which supplies vapor that contains hydrogen fluoride to the front surface of the substrate.

Where a silicon substrate is used as a substrate, there is a case that a silicon oxide may exist on a front surface of the substrate. In this case, an adhered product which adheres the leading end portions of collapsed patterns together is considered to mainly contain a silicon oxide.

In this method, vapor which contains hydrogen fluoride is supplied to a front surface of a substrate. As shown in Formula (1), hydrogen fluoride reacts with a silicon oxide and is decomposed into $H_2SiF_6$ and water.

$$SiO_2 + 6HF \rightarrow H_2SiF_6 - 2H_2O \qquad (1)$$

Therefore, where the leading end portions of collapsed patterns are adhered to each other with a silicon oxide, vapor which contains hydrogen fluoride supplied to the front surface of the substrate reacts with an adhered product that contains a silicon oxide to undergo decomposition. Thereby, it is possible to remove the adhered product from the leading end portion of the pattern.

By removing the adhered product from the leading end portion of the pattern, a force of the pattern will rise up (recover) due to elasticity of the pattern itself acting on the collapsed pattern. Thereby, it is possible to recover the collapsed pattern.

The collapsed pattern recovering method may further include a substrate heating step which heats the substrate in parallel with the hydrogen fluoride vapor supplying step.

Hydrogen fluoride reacts with a silicon oxide, by which residue (for example, residue of $H_2SiF_6$) may be generated.

In this method, the substrate is heated in parallel with supply of vapor that contains hydrogen fluoride to the substrate. Thereby, residue can be evaporated and removed from the front surface of the substrate.

A heating temperature on a front surface of a substrate is set higher than a boiling point of $H_2SiF_6$ (approximately 109° C.), for example.

The collapsed pattern recovering method may further include a water vapor supplying step which supplies water vapor to the front surface of the substrate after the hydrogen fluoride vapor supplying step.

Fluorine may remain on the front surface of the substrate after the hydrogen fluoride vapor supplying step.

In this method, after the hydrogen fluoride vapor supplying step, water vapor is supplied to the front surface of the substrate. Since water vapor favorably reacts with fluorine, fluorine remaining on the front surface of the substrate is removed by water vapor supplied to the front surface of the substrate. Thereby, it is possible to recover the collapsed pattern without generating residual fluorine.

The reactive gas supplying step may include an ozone gas supplying step which supplies a gas that contains ozone gas to the front surface of the substrate.

In this method, a gas that contains ozone gas is supplied to a front surface of a substrate. There is a case that an organic substance may exist on the front surface of the substrate depending on the type of a processing liquid used in substrate processing. In this case, an adhered product which adheres the leading end portions of collapsed patterns together is considered to mainly contain an organic substance.

Ozone gas reacts with an organic substance. Therefore, where the leading end portions of collapsed patterns are adhered to each other by an organic substance, the gas containing ozone gas that is supplied to a front surface of a substrate reacts with an adhered product that contains an organic substance to undergo decomposition and, thereby, the adhered product is removed from the leading end portion of the pattern.

When the adhered product is removed from the leading end portion of the pattern, a force of the pattern will rise up (recover) due to elasticity of the pattern itself acting on the collapsed pattern. Thereby, it is possible to recover the collapsed pattern.

The present invention provides a method for processing a substrate in which a pattern is formed on a front surface thereof, that is, the substrate processing method which includes a processing liquid supplying step which supplies a processing liquid to the front surface of the substrate, a spin drying step in which the substrate is rotated at a high speed and dried by spinning off the liquid after the processing liquid supplying step, and a pattern recovering step which is executed after the spin drying step, the pattern recovering step in which a reactive gas supplying step for supplying to the front surface of the substrate a reactive gas that can react with a product existing on the front surface is executed to recover the collapsed pattern.

The inventor of the present application has found the following. That is, where a pattern which has elasticity is collapsed, the collapsed pattern acts to some extent on the force to rise up (recover) due to the elasticity of the pattern itself.

However, in reality, a collapsed state is retained even though the pattern has elasticity. The inventor of the present application considers that, as one of the factors for retaining the collapsed state, adjacent patterns are collapsed, the leading end portions thereof come into contact with each other, and the leading end portions in contact with each other are adhered by a product generated in association with substrate processing.

In this method, to a front surface of a substrate, a reactive gas that can react with a product existing on the front surface is supplied. Where the leading end portions of the collapsed patterns are adhered to each other by the product, the reactive gas supplied to the front surface of the substrate reacts with an adhered product and the adhered product is decomposed by the reaction. Thereby, it is possible to remove the adhered product from the leading end portion of the pattern.

When the adhered product is removed from the leading end portion of the pattern, a force of the pattern will rise up (recover) due to the elasticity of the pattern itself acting on the collapsed pattern. Thereby, it is possible to recover the collapsed pattern in the pattern recovering step.

Further, the pattern recovering step is executed after the spin drying step. In the spin drying step on substrate processing, even where a pattern formed on a front surface of a substrate is collapsed, the collapsed pattern can be recovered in the pattern recovering step which is executed subsequently.

In a preferred embodiment of the present invention, the reactive gas supplying step includes a hydrogen fluoride vapor supplying step which supplies vapor that contains hydrogen fluoride to the front surface of the substrate.

Where a silicon substrate is used as a substrate, there is a case that a silicon oxide may exist on a front surface of the substrate. In this case, an adhered product which adheres the leading end portions of the collapsed patterns together is considered to mainly contain a silicon oxide.

In this method, vapor that contains hydrogen fluoride is supplied to a front surface of a substrate. As shown in Formula (2), hydrogen fluoride reacts with a silicon oxide and is decomposed into $H_2SiF_6$ and water.

$$SiO_2 + 6HF \rightarrow H_2SiF_6 + 2H_2O \qquad (2)$$

Therefore, where the leading end portions of the collapsed patterns are adhered to each other by a silicon oxide, hydrogen fluoride-containing vapor which is supplied to the front surface of the substrate reacts with an adhered product that contains a silicon oxide to undergo decomposition. Thereby, it is possible to remove the adhered product from the leading end portion of the pattern.

By removing the adhered product from the leading end portion of the pattern, a force of the pattern will rise up (recover) due to elasticity of the pattern itself acting on the collapsed pattern. Thereby, it is possible to recover the collapsed pattern.

The substrate processing method may further include a substrate heating step which heats the substrate in parallel with the hydrogen fluoride vapor supplying step.

Hydrogen fluoride reacts with a silicon oxide, by which residue (for example, residue of $H_2SiF_6$) may be generated.

In this method, a substrate is heated in parallel with supply of vapor that contains hydrogen fluoride to the substrate. Thereby, residue can be evaporated and removed from the front surface of the substrate.

A heating temperature on the front surface of the substrate is set higher than a boiling point (approximately 109° C.) of $H_2SiF_6$, for example.

The substrate processing method may further include a water vapor supplying step which supplies water vapor to the front surface of the substrate after the hydrogen fluoride vapor supplying step.

Fluorine may remain on the front surface of the substrate after the hydrogen fluoride vapor supplying step.

In this method, after the hydrogen fluoride vapor supplying step, water vapor is supplied to a front surface of a substrate. Since water vapor favorably reacts with fluorine, fluorine remaining on the front surface of the substrate is removed by the water vapor supplied to the front surface of the substrate. Thereby, it is possible to recover the collapsed pattern without generating residual fluorine.

The reactive gas supplying step may include an ozone gas supplying step which supplies a gas that contains ozone gas to the front surface of the substrate.

In this method, a gas that contains ozone gas is supplied to a front surface of a substrate. There is a case that an organic substance may exist on the front surface of the substrate, depending on the type of a processing liquid used in substrate processing. In this case, an adhered product which adheres the leading end portions of the collapsed patterns together is considered to mainly contain an organic substance.

Ozone gas reacts with an organic substance. Therefore, where the leading end portions of the collapsed patterns are adhered to each other by an organic substance, the gas that contains ozone gas supplied to a front surface of a substrate reacts with the adhered product that contains an organic substance to undergo decomposition, by which the adhered product is removed from the leading end portion of the pattern.

Where the adhered product is removed from the leading end portion of the pattern, a force of the pattern will rise up (recover) due to the elasticity of the pattern itself acting on the collapsed pattern. Thereby, it is possible to recover the collapsed pattern.

The present invention provides a substrate processing apparatus which includes a substrate holding unit which holds a substrate in which a pattern is formed on a front surface thereof, a rotation unit for rotating the substrate held by the substrate holding unit around a rotation axis passing through a central portion of the substrate, a processing liquid supplying unit for supplying a processing liquid to the front surface of the substrate held by the substrate holding unit, a reactive gas supplying unit for supplying, to the front surface of the substrate held by the substrate holding unit, a reactive gas that can react with a product existing on the front surface, and a controller for controlling the rotation unit, the processing liquid supplying unit and the reactive gas supplying unit, in which the controller executes a processing liquid supplying step which supplies a processing liquid to the front surface of the substrate, a spin drying step in which the substrate is rotated at a high speed and dried by spinning off the liquid after the processing liquid supplying step, and a pattern recovering step which is executed after the spin drying step, that is, the pattern recovering step in which a reactive gas supplying step for supplying to the front surface of the substrate a reactive gas that can react with a product existing on the front surface is executed to recover the collapsed pattern.

The inventor of the present application has found the following. That is, where a pattern which has elasticity is collapsed, the collapsed pattern acts to some extent on the force to rise up (recover) due to elasticity of the pattern itself.

However, in reality, a collapsed state is retained even though the pattern has elasticity. The inventor of the present application considers that, as one of the factors for retaining the collapsed state, adjacent patterns are collapsed, the leading end portions thereof come into contact with each other, and the leading end portions in contact with each other are adhered by a product generated in association with substrate processing.

With this arrangement, in the pattern recovering step, a reactive gas that can react with a product existing on the front surface thereof is supplied to a front surface of a substrate. Where the leading end portions of the collapsed patterns are adhered to each other by the product, the reactive gas supplied to the front surface of the substrate reacts with the adhered product and the adhered product is removed from the leading end portion of the pattern by the reaction.

When the adhered product is removed from the leading end portion of the pattern, a force of the pattern will rise up (recover) due to the elasticity of the pattern itself acting on the collapsed pattern. Thereby, it is possible to recover the collapsed pattern in the pattern recovering step.

Further, the pattern recovering step is executed after the spin drying step. In the spin drying step on substrate processing, even where a pattern formed on a front surface of a substrate has collapsed, it is possible to recover the collapsed pattern in the pattern recovering step which is subsequently executed.

In a preferred embodiment of the present invention, the controller executes, in the reactive gas supplying step, a hydrogen fluoride vapor supplying step which supplies vapor that contains hydrogen fluoride to the front surface of the substrate.

Where a silicon substrate is used as a substrate, there is a case that a silicon oxide may exist on a front surface of a substrate. In this case, an adhered product which adheres the leading end portions of collapsed patterns together is considered to mainly contain a silicon oxide.

With this arrangement, vapor that contains hydrogen fluoride is supplied to a front surface of a substrate. As shown in Formula (3), hydrogen fluoride reacts with a silicon oxide and is decomposed into $H_2SiF_6$ and water.

$$SiO_2 + 6HF \rightarrow H_2SiF_6 + 2H_2O \qquad (3)$$

Therefore, where the leading end portions of the collapsed patterns are adhered to each other by a silicon oxide, vapor that contains hydrogen fluoride supplied to the front surface of the substrate reacts with an adhered product which contains a silicon oxide to undergo decomposition. Thereby, it is possible to remove the adhered product from the leading end portion of the pattern.

By removing the adhered product from the leading end portion of the pattern, by which a force of the pattern will rise up (recover) due to the elasticity of the pattern itself acting on the collapsed pattern. Thereby, it is possible to recover the collapsed pattern.

The substrate processing method may further include a substrate heating step which heats the substrate in parallel with the hydrogen fluoride vapor supplying step.

Hydrogen fluoride reacts with a silicon oxide, by which residue (for example, residue of $H_2SiF_6$) may be generated.

With this arrangement, a substrate is heated in parallel with supply of vapor that contains hydrogen fluoride to the substrate. Thereby, residue can be evaporated and removed from a front surface of the substrate.

A heating temperature on the front surface of the substrate is set higher than a boiling point (approximately 109° C.) of $H_2SiF_6$, for example.

The controller may further execute a substrate heating step which heats the substrate in parallel with the hydrogen fluoride vapor supplying step.

Fluorine may remain on the front surface of the substrate after the hydrogen fluoride vapor supplying step.

With this arrangement, after the hydrogen fluoride vapor supplying step, water vapor is supplied to a front surface of a substrate. Since water vapor favorably reacts with fluorine, fluorine remaining on the front surface of the substrate is removed by the water vapor supplied to the front surface of the substrate. Thereby, it is possible to recover the collapsed pattern without generating residual of fluorine.

The controller may execute, in the reactive gas supplying step, an ozone gas supplying step which supplies a gas that contains ozone gas to the front surface of the substrate.

With this arrangement, a gas that contains ozone gas is supplied to a front surface of a substrate. There is a case that an organic substance may exist on the front surface of the substrate depending on the type of processing liquid used in substrate processing. In this case, an adhered product which adheres the leading end portions of the collapsed patterns together is considered to mainly contain an organic substance.

Ozone gas will react with an organic substance. Therefore, where the leading end portions of the collapsed patterns are adhered to each other by an organic substance, the gas that contains ozone gas supplied to a front surface of a substrate reacts with an adhered product that contains an organic substance to undergo decomposition. Thereby, the adhered product is removed from the leading end portion of the pattern.

When the adhered product is removed from the leading end portion of the pattern, a force of the pattern will rise up (recover) due to the elasticity of the pattern itself acting on the collapsed pattern. Thereby, it is possible to recover the collapsed pattern.

The above and other objects, features, and effects of the present invention will become more apparent from the following detailed description of the preferred embodiments with reference to the attached drawings.

BRIEF DESCRIPTION OF DRAWINGS

FIG. 5B is a flowchart for describing the first substrate processing example executed by the substrate processing apparatus.

FIG. 13 is a drawing which shows results of a first recovery test.

FIG. 14A, 14B are each an image view which shows results of the first recovery test.

FIG. 15 is a drawing which shows results of a second recovery test.

DESCRIPTION OF EMBODIMENTS

Figure 1:
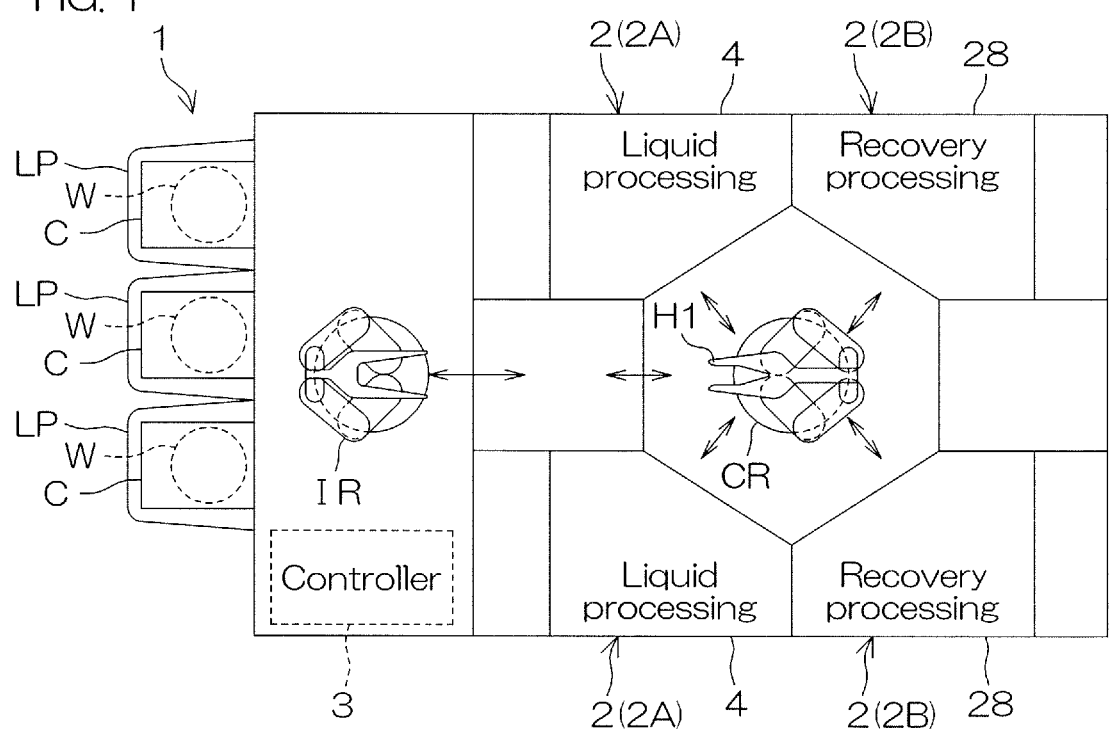
FIG. 1 is a plan view for describing a layout inside a substrate processing apparatus according to a first preferred embodiment of the present invention.

FIG. 1 is an illustrative plan view for describing a layout inside a substrate processing apparatus 1 according to a preferred embodiment of the present invention. The substrate processing apparatus 1 is a single substrate processing type apparatus which processes disk-shaped substrates W such as semiconductor wafers one at a time by using a processing liquid or a processing gas. A pattern is formed on a front surface of a substrate W which is to be processed by the substrate processing apparatus 1. The substrate processing apparatus 1 includes a plurality of processing units 2 which process a substrate W, a load port LP at which a carrier C for housing a plurality of substrates W processed by the processing units 2 is placed, transfer robots IR and CR which transfer a substrate W between the load port LP and the processing unit 2, and a controller 3 which controls the substrate processing apparatus 1. The transfer robot IR and the substrate transfer robot CR are controlled by the controller 3. The transfer robot IR transfers a substrate W between the carrier C and the substrate transfer robot CR. The substrate transfer robot CR transfers a substrate W between the transfer robot IR and the processing unit 2. The plurality of processing units 2 each include a liquid processing unit 2A which supplies a processing liquid to a front surface (pattern forming surface) of a substrate W to process the substrate W by the processing liquid and a recovery processing unit 2B which recovers a pattern which has collapsed as a result of processing by the liquid processing unit 2A.

Figure 2:
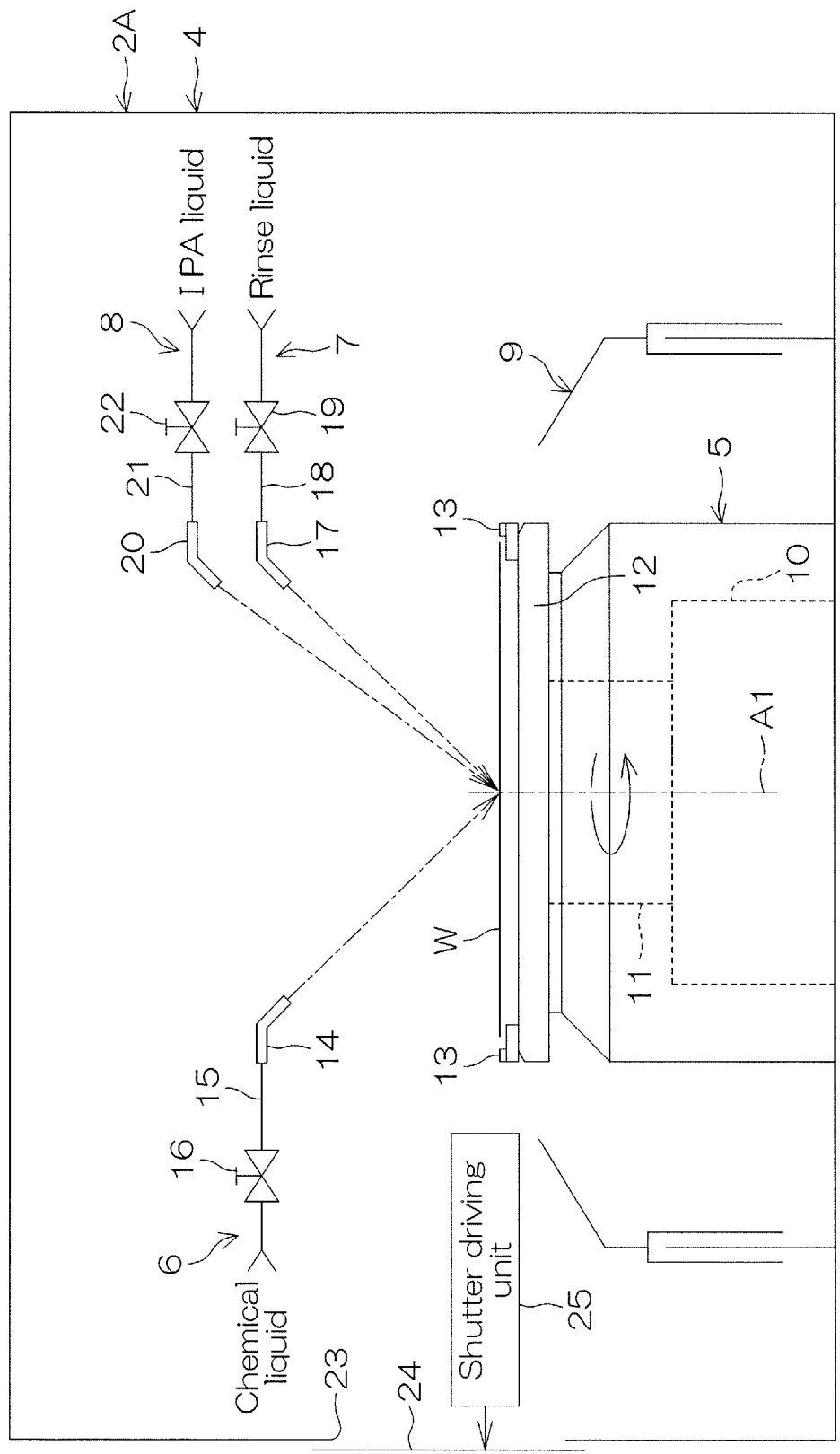
FIG. 2 is an illustrative sectional view for describing a configuration example of a liquid processing unit provided in the substrate processing apparatus.

FIG. 2 is an illustrative sectional view for describing a configuration example of the liquid processing unit 2A provided in the substrate processing apparatus 1.

The liquid processing unit 2A processes a substrate W by using a cleaning chemical liquid or an etching liquid. The liquid processing unit 2A includes a box-shaped first chamber 4, a spin chuck (substrate holding unit, rotation unit) 5 which rotates a substrate W around a vertical rotation axis A1 passing through a central portion of the substrate W, while holding the substrate W horizontally inside the first chamber 4, a chemical liquid supplying unit (processing liquid supplying unit) 6 which supplies a chemical liquid to an upper surface of the substrate W held by the spin chuck 5, a rinse liquid supplying unit (processing liquid supplying unit) 7 which supplies a rinse liquid to the upper surface of the substrate W, an organic solvent supplying unit (processing liquid supplying unit) 8 which supplies an organic solvent liquid lower in surface tension than water to the upper surface of the substrate W held by the spin chuck 5, and a tubular processing cup 9 which surrounds the spin chuck 5.

As the spin chuck 5, a clamping type chuck is adopted in which a substrate W is held horizontally, with the substrate W clamped in a horizontal direction. Specifically, the spin chuck 5 includes a spin motor 10, a spin shaft 11 which is formed integrally with a driving shaft of the spin motor 10, and a disk-shaped spin base 12 which is attached substantially horizontally to an upper end of the spin shaft 11.

A plurality (three or more, for example, six) clamping members 13 are arranged at a peripheral edge portion of an upper surface of the spin base 12. The plurality of clamping members 13 are arranged at appropriate intervals on a circumference corresponding to an outer peripheral shape of a substrate W at the peripheral edge portion of the upper surface of the spin base 12.

Also, the spin chuck 5 is not restricted to a clamping type and, for example, a vacuum-suction type arrangement (vacuum chuck) that vacuum-suctions a rear surface of a substrate W to hold the substrate W in a horizontal posture and further performs rotation around a vertical rotation axis in this state to rotate the substrate W held by the spin chuck 5 may be adopted instead.

The chemical liquid supplying unit 6 includes a chemical liquid nozzle 14. The chemical liquid nozzle 14 is, for example, a straight nozzle which discharges a liquid in a continuously flowing state and arranged above the spin chuck 5, with a discharge port thereof fixed toward a central portion of an upper surface of a substrate W. A chemical liquid line 15 to which a chemical liquid from a chemical liquid supply source is supplied is connected to the chemical liquid nozzle 14. A chemical liquid valve 16 for switching supply/supply stop of a chemical liquid from the chemical liquid nozzle 14 is interposed at an intermediate portion of the chemical liquid line 15. When the chemical liquid valve 16 is opened, the chemical liquid in a continuous flow supplied from the chemical liquid line 15 to the chemical liquid nozzle 14 is discharged from a discharge port set at a lower end of the chemical liquid nozzle 14. Further, when the chemical liquid valve 16 is closed, supply of the chemical liquid from the chemical liquid line 15 to the chemical liquid nozzle 14 is stopped. The chemical liquid is a liquid which contains at least one of, for example, sulfuric acid, acetic acid, nitric acid, hydrochloric acid, hydrofluoric acid, ammonia water, hydrogen peroxide water, an organic acid (for example, citric acid, oxalic acid, etc.), an organic alkali (for example, TMAH: tetramethylammonium hydroxide, etc.), an organic solvent (for example, IPA: isopropyl alcohol, etc.), a surfactant, and a corrosion inhibitor.

The rinse liquid supplying unit 7 includes a rinse liquid nozzle 17. The rinse liquid nozzle 17 is, for example, a straight nozzle which discharges a liquid in a continuously flowing state and arranged above the spin chuck 5, with a discharge port thereof fixed toward a central portion of an upper surface of a substrate W. A rinse liquid line 18 to which a rinse liquid from a rinse liquid supply source is supplied is connected to the rinse liquid nozzle 17. A rinse liquid valve 19 which switches supply/supply stop of the rinse liquid from the rinse liquid nozzle 17 is interposed at an intermediate portion of the rinse liquid line 18. When the rinse liquid valve 19 is opened, the rinse liquid in a continuous flow supplied from the rinse liquid line 18 to the rinse liquid nozzle 17 is discharged from a discharge port set at a lower end of the rinse liquid nozzle 17. Further, when the rinse liquid valve 19 is closed, supply of the rinse liquid from the rinse liquid line 18 to the rinse liquid nozzle 17 is stopped. The rinse liquid is, for example, deionizer water (DIW). The rinse water is not restricted to DIW and may be any one of carbonated water, electrolyzed ion water, hydrogen water, ozone water and aqueous hydrochloric acid solution of diluted concentration (of, for example, approximately 10 ppm to 100 ppm).

The organic solvent supplying unit 8 includes an organic solvent nozzle 20. The organic solvent nozzle 20 is, for example, a straight nozzle which discharges a liquid in a continuously flowing state and arranged above the spin chuck 5, with a discharge port thereof fixed toward a central portion of an upper surface of a substrate W. An organic solvent line 21 to which a liquid-type organic solvent from an organic solvent supply source is supplied is connected to the organic solvent nozzle 20. An organic solvent valve 22 which switches supply/supply stop of an organic solvent from the organic solvent nozzle 20 is interposed at an intermediate portion of the organic solvent line 21. When the organic solvent valve 22 is opened, the organic solvent in a continuous flow supplied from the organic solvent line 21 to the organic solvent nozzle 20 is discharged from a discharge port set at a lower end of the organic solvent nozzle 20. Further, when the organic solvent valve 22 is closed, supply of a liquid-type organic solvent from the organic solvent line 21 to the organic solvent nozzle 20 is stopped. The liquid-type organic solvent is, for example, isopropyl alcohol (IPA). Methanol, ethanol, acetone and HEF (hydrofluoroether) can be cited as an example of the liquid-type organic solvent other than IPA. They are all an organic solvent which is lower in surface tension than water (DIW).

Further, the chemical liquid nozzle 14, the rinse liquid nozzle 17 or the organic solvent nozzle 20 is not required to be arranged, with each of them being fixed to the spin chuck 5. A mode of what-is-called a scanning type nozzle may be adopted in which the nozzle is attached, for example, to an arm capable of swinging in a horizontal plane above the spin chuck 5 to scan a position at which a processing liquid is placed on an upper surface of a substrate W by swinging of the arm.

A carry-in/carry-out port 23 for carrying in and carrying out a substrate W is formed on a partition wall on the first chamber 4 side. The liquid processing unit 2A further includes a shutter driving unit 25 which includes a shutter 24 for opening and closing the carry-in/carry-out port 23 and a cylinder, etc., which drives the shutter 24 to open or close.

Figure 3:
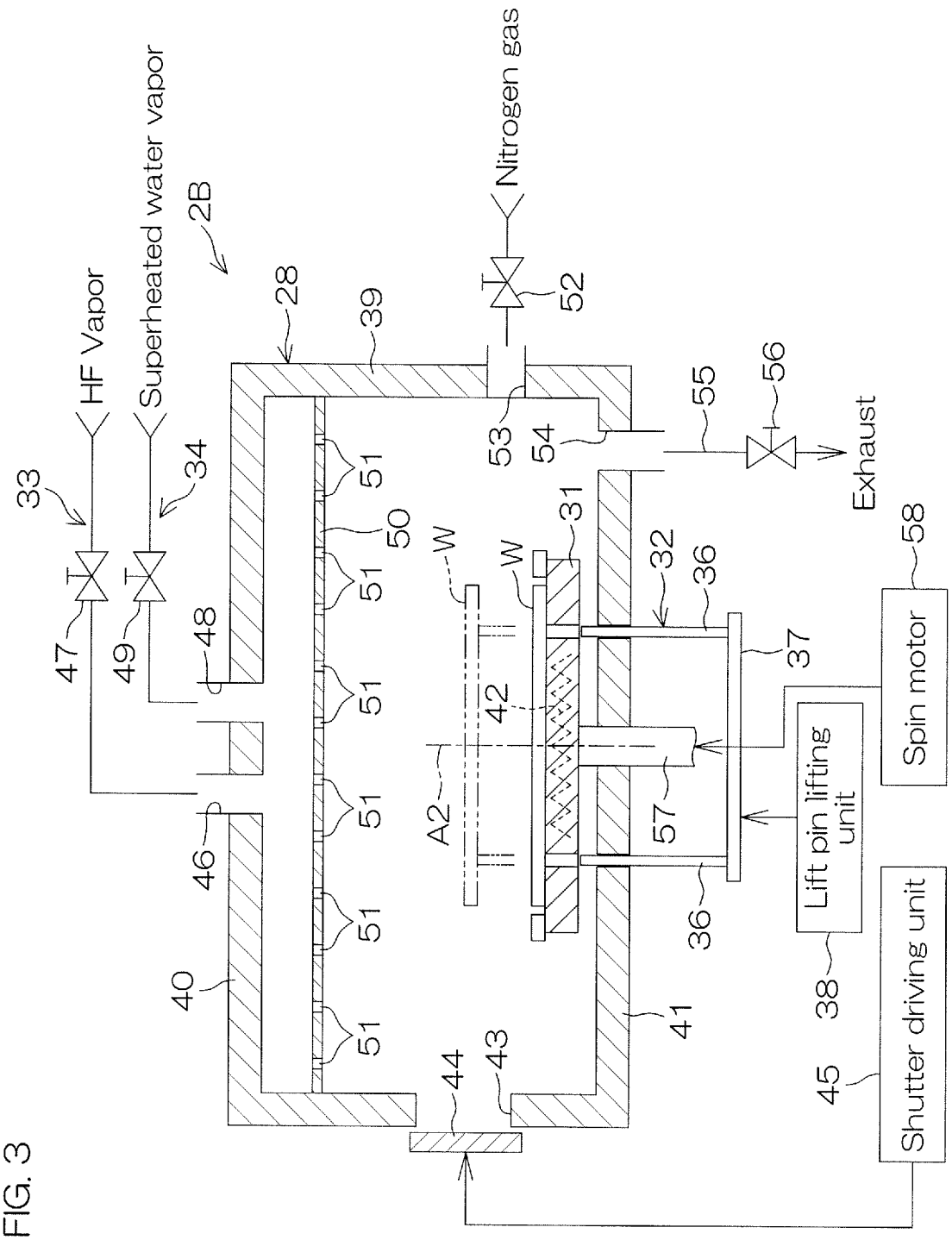
FIG. 3 is an illustrative sectional view for describing a configuration example of a recovery processing unit provided in the substrate processing apparatus.

FIG. 3 is an illustrative sectional view for describing a configuration example of the recovery processing unit 2B provided in the substrate processing apparatus 1.

The recovery processing unit 2B supplies a reactive gas (reactive gas that can react with a product existing on a front surface of a substrate W) to the front surface of the substrate W to recover a pattern. As the reactive gas, the recovery processing unit 2B uses vapor that contains hydrogen fluoride (HF) (HF vapor, hereinafter referred to as "hydrogen fluoride vapor").

The recovery processing unit 2B includes, for example, a tubular (cylindrical) second chamber 28, a substrate holding unit 32 which is housed inside the second chamber 28 to include a holding plate 31, a hydrogen fluoride vapor supplying unit (reactive gas supplying unit) 33 which supplies hydrogen fluoride vapor (HF vapor) to an upper surface of a substrate W held by the holding plate 31, and a water vapor supplying unit 34 which supplies water vapor to the upper surface of the substrate W held by the holding plate 31.

The second chamber 28 includes a peripheral wall 39 as well as an upper wall 40 and a bottom wall 41 which face each other up and down. The second chamber 28 is a vapor process chamber (VPC) which processes a substrate W by using vapor.

A heater 42 which heats a substrate W held by the holding plate 31 is embedded inside the holding plate 31. The heater 42 generates heat to warm an upper surface of the holding plate 31. That is, the holding plate 31 functions as a hot plate and holds the substrate W from below and also heats the substrate W to be held from below.

The substrate holding unit 32 further includes a plurality (for example, three) of lift pins 36 which raise and lower a substrate W in relation to the holding plate 31, a common supporting member 34 which supports the plurality of lift pins 36, and a lift pin lifting unit 38 which is coupled to the supporting member 37 and includes a cylinder.

The holding plate 31 is fixed to an upper end of a rotating shaft 57 extending in a vertical direction. A spin motor 58 which rotates the rotating shaft 57 around a rotation axis A2 in alignment with the central axis of the rotating shaft 57 is coupled to the rotating shaft 57.

The plurality of lift pins 36 are inserted through the bottom wall 41 of the second chamber 28 and supported by the supporting member 37 outside the second chamber 28. The lift pin lifting unit 38 integrally raises and lowers the plurality of lift pins 36 between an upper position at which the leading ends of the plurality of lift pins 36 are projected above the holding plate 31 (for example, a position at which a substrate W can be delivered between the holding plate and the substrate transfer robot CR and which is indicated by an alternate long and two short dashed line in FIG. 3) and a lower position at which the leading ends of the plurality of lift pins 36 are retracted below the holding plate 31 (which is indicated by a solid line in FIG. 3).

Further, a carry-in/carry-out port 43 for carrying in and carrying out a substrate W inside the second chamber 28 is formed on a peripheral wall 39 of the second chamber 28. A shutter 44 which opens and closes the carry-in/carry-out port 43 is disposed outside the peripheral wall 39. A shutter driving unit 45 that includes a cylinder, etc., is coupled to the shutter 44. The shutter driving unit 45 allows the shutter 44 to move between a closed position at which the carry-in/carry-out port 43 is sealed by the shutter 44 and an opened position at which the carry-in/carry-out port 43 is opened.

As shown in FIG. 3, the hydrogen fluoride vapor supplying unit 33 includes a hydrogen fluoride vapor introducing line 46 which is disposed on the upper wall 40 of the second chamber 28. Hydrogen fluoride vapor (HF vapor) from a hydrogen fluoride vapor supply source is supplied to the hydrogen fluoride vapor introducing line 46. The hydrogen fluoride vapor (HF vapor) supplied to the hydrogen fluoride vapor introducing line 46 may contain a carrier gas (for example, an inert gas such as nitrogen gas). The hydrogen fluoride vapor introducing line 46 penetrates through the upper wall 40 to introduce hydrogen fluoride vapor (HF vapor) into the second chamber 28. The hydrogen fluoride vapor supplying unit 33 further includes a hydrogen fluoride vapor valve 47 which opens and closes the hydrogen fluoride vapor introducing line 46.

The water vapor supplying unit 34 includes a water vapor introducing line 48 which is disposed on the upper wall 40 of the second chamber 28. Water vapor from a water vapor supply source is supplied to the water vapor introducing line 48. The water vapor supplied from the water vapor introducing line 48 may contain a carrier gas (for example, an inert gas such as nitrogen gas). The water vapor introducing line 48 penetrates through the upper wall 40 to introduce water vapor into the second chamber 28. The water vapor introduced into the second chamber 28 from the water vapor introducing line 48 is preferably superheated water vapor which is higher in temperature than a boiling point of water (for example, approximately 140° C.). The water vapor supplying unit 34 further includes a water vapor valve 49 which opens and closes the water vapor introducing line 48.

A rectifier 50 is arranged horizontally between the upper wall 40 and the holding plate 31 inside the second chamber 28. Many discharge holes 51 facing an interior of the second chamber 28 are formed in the rectifier 50. A diffusion space for diffusing a gas (hydrogen fluoride vapor (HF vapor) and water vapor) supplied into the second chamber 28 is divided between the upper wall 40 and the rectifier 50.

When the hydrogen fluoride vapor valve 47 is opened, hydrogen fluoride vapor (HF vapor) from the hydrogen fluoride vapor introducing line 46 is supplied into the second chamber 28. The hydrogen fluoride vapor (HF vapor) from the hydrogen fluoride vapor introducing line 46 is discharged by being dispersed from many discharge holes 51 of the rectifier 50, assuming a shower mode flowing at a substantially uniform flow rate in a plane parallel to an inner surface of the upper wall 40 inside the second chamber 28 and falling on a substrate W held by the holding plate 31.

Further, when the water vapor valve 49 is opened, water vapor from the water vapor introducing line 48 is supplied into the second chamber 28. The water vapor from the water vapor introducing line 48 is discharged by being dispersed from many discharge holes 51 of the rectifier 50, assuming a shower mode flowing at a substantially uniform flow rate in a plane parallel to an inner surface of the upper wall 40 inside the second chamber 28 and falling on a substrate W held by the holding plate 31.

Further, an inert gas introducing line 53 which introduces nitrogen gas, an example of inert gas, into the second chamber 28 is disposed, for example, on the peripheral wall 39 of the second chamber 28. An inert gas is supplied via an inert gas valve 52 into the inert gas introducing line 53. The inert gas introducing line 53 may be disposed, for example, on the upper wall.

Still further, an exhaust port 54 is formed at the bottom wall 41 of the second chamber 28. A base end of the exhaust line 55, a leading end of which is connected to an exhaust source (not shown), is connected to the exhaust port 54. An exhaust valve 56 is interposed at an intermediate portion of the exhaust line 55. When the exhaust valve 56 is opened, an atmosphere inside the second chamber 28 is exhausted from the exhaust port 54. When the exhaust valve 56 is closed, exhaust from the exhaust port 54 is stopped.

Figure 4:
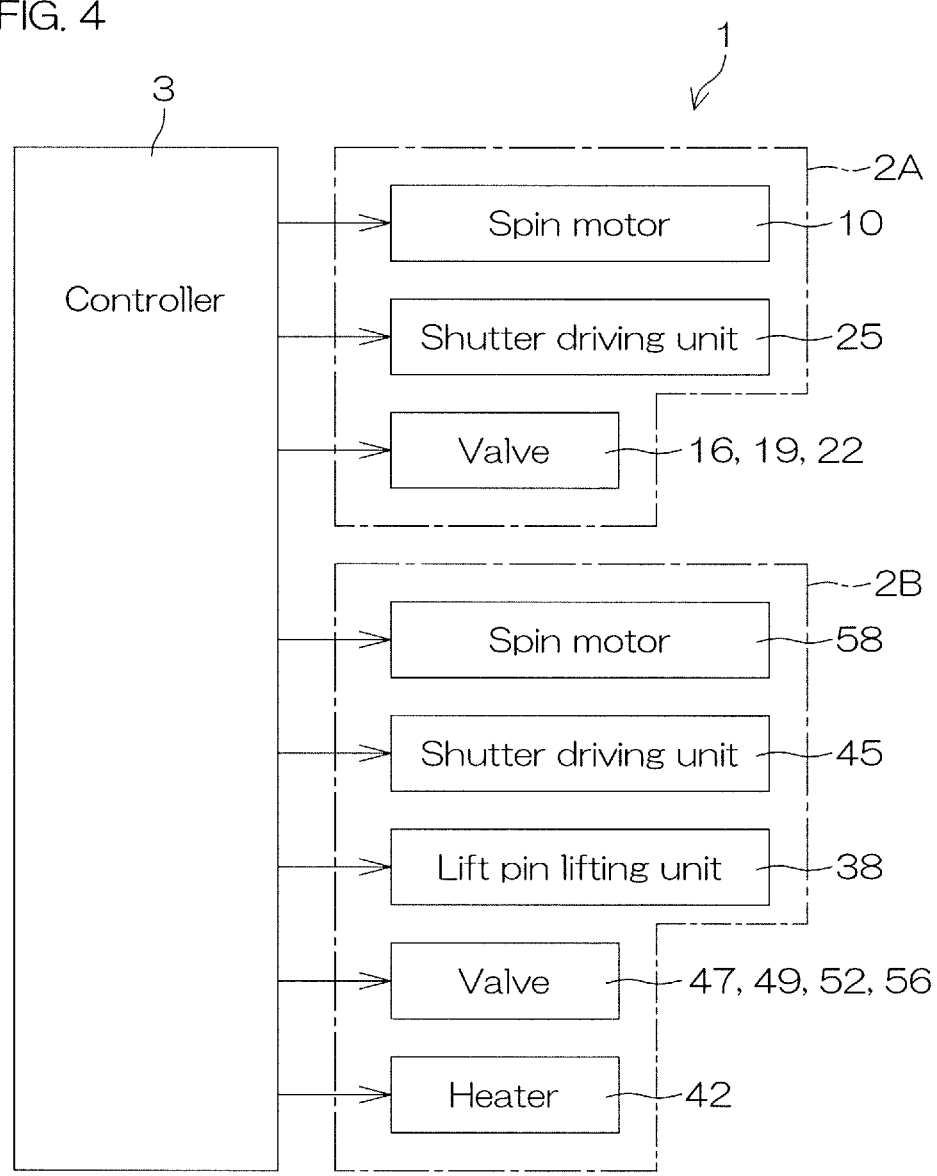
FIG. 4 is a block diagram for describing an electrical configuration of main portions of the substrate processing apparatus.

FIG. 4 is a block diagram for describing an electrical configuration of main portions of the substrate processing apparatus 1.

The controller 3 is configured by using a microcomputer, for example. The controller 3 has a computing unit such as a CPU, a storage unit such as a fixed memory device or a hard disk drive, and an input/output unit. Programs executed by the computing unit are stored in the storage unit.

The controller 3 also controls motions of the spin motor 10, the shutter driving unit 25, the spin motor 58, the lift pin lifting unit 38, the shutter driving unit 45, the heater 42, etc., according to predetermined programs. Further, the controller 3 opens and closes the chemical liquid valve 16, the rinse liquid valve 19, the organic solvent valve 22, the hydrogen fluoride vapor valve 47, the water vapor valve 49, the inert gas valve 52, the exhaust valve 56, etc., according to predetermined programs.

Figure 5A:
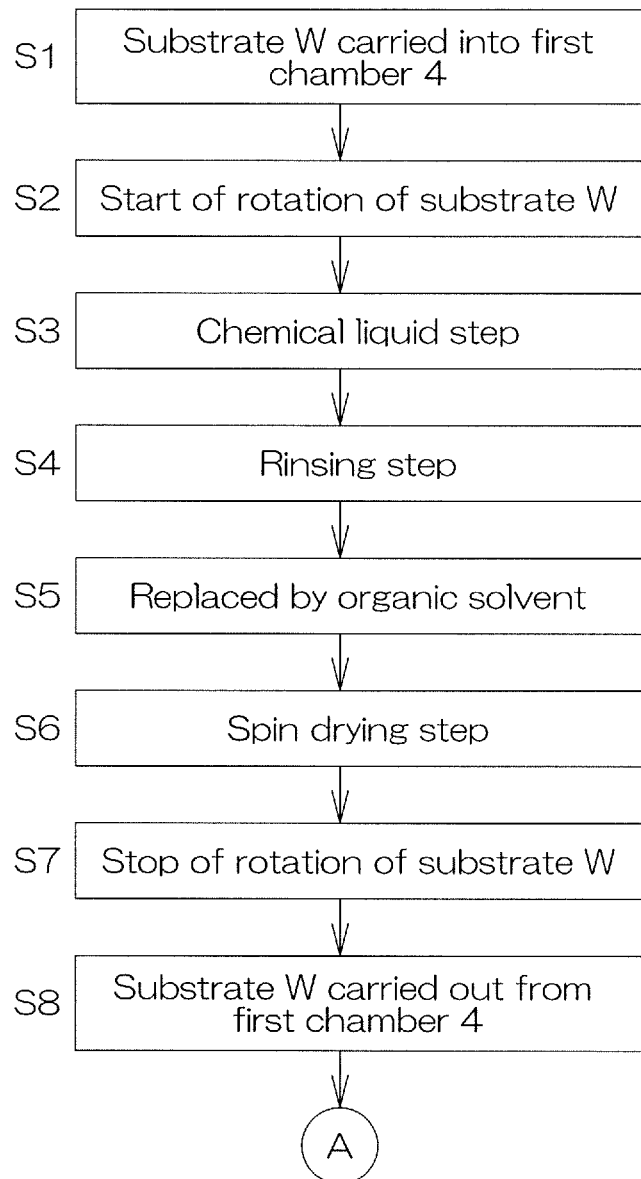
FIG. 5A is a flowchart for describing a first substrate processing example executed by the substrate processing apparatus.
Figure 6A:
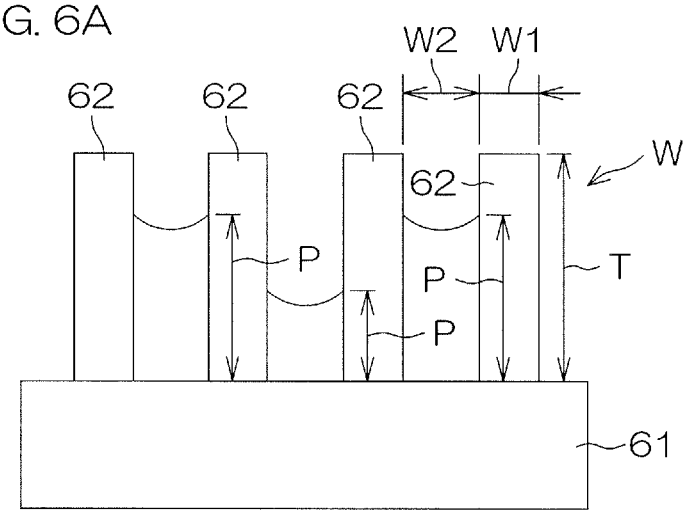
FIG. 6A to 6C are each an illustrative drawing for describing collapse of a pattern.
Figure 6B:
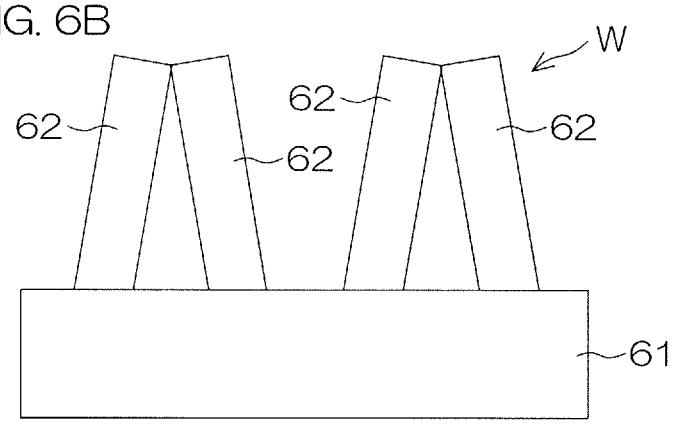
Figure 6C:
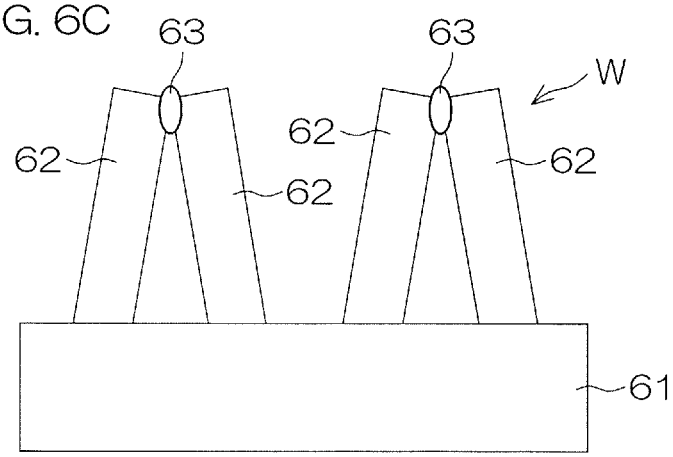
Figure 7A:
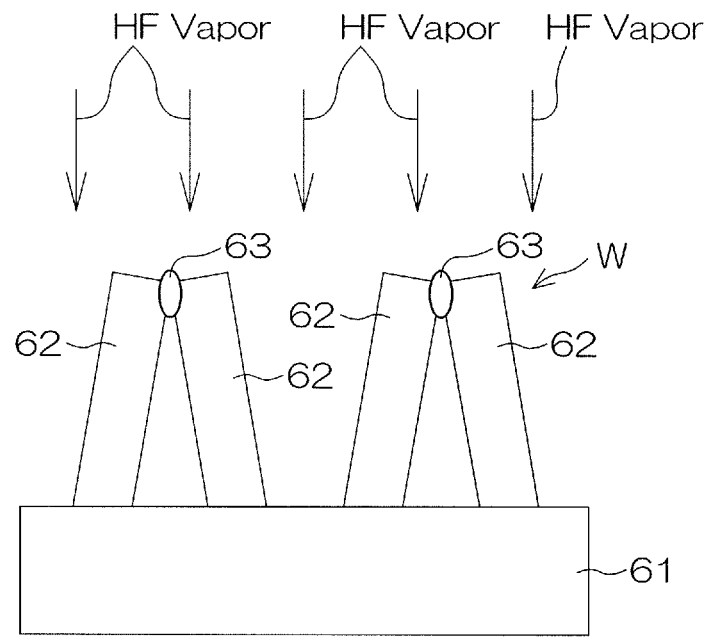
FIGS. 7A and 7B are each an illustrative drawing for describing recovery of the collapsed pattern.
Figure 7B:
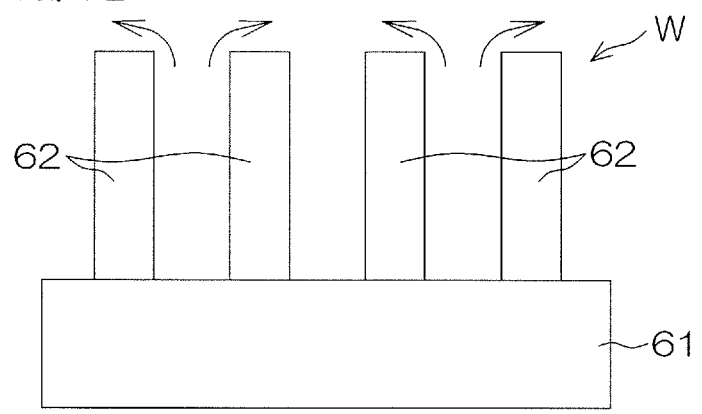

FIGS. 5A and 5B are each a flowchart for describing a first substrate processing example executed by the substrate processing apparatus 1 (the liquid processing unit 2A and the recovery processing unit 2B). FIG. 6A to 6C are each an illustrative drawing for describing collapse of a pattern 62. FIGS. 7A and 7B are each an illustrative drawing for describing recovery of the collapsed pattern 62.

Hereinafter, a description will be given of the first substrate processing example by referring to FIG. 1 to FIG. 5B. FIG. 6A to 6C and FIGS. 7A and 7B will be referred to as necessary. When the first substrate processing example is performed by the substrate processing apparatus 1, first, a substrate W is subjected to liquid processing by the liquid processing unit 2A and, thereafter, the substrate W is subjected to recovery processing by the recovery processing unit 2B. The liquid processing given to the substrate W by the liquid processing unit 2A is cleaning processing or etching processing.

First, a description will be given of the liquid processing given to a substrate W by the liquid processing unit 2A. When the liquid processing is executed by the liquid processing unit 2A, a substrate W which is not cleaned is transferred to an interior of the first chamber 4 (Step S1 in FIG. 5A).

Specifically, the controller 3 allows a hand H1 (refer to FIG. 1) of the substrate transfer robot CR (refer to FIG. 1) which holds a substrate W to enter into the first chamber 4. Thereby, the substrate W is delivered to the spin chuck 5 in a state that a front surface thereof (a surface to be processed) faces upward. Thereafter, the substrate W is held by the spin chuck 5. The substrate W which is delivered into the first chamber 4 is such that, for example, as shown in FIG. 6A, etc., a fine pattern (thin film pattern) 62 is formed on a front surface of silicon (Si) substrate 61 (an example of semiconductor substrate). The pattern 62 may be formed, for example, in such a dimension that a line width W1 is approximately 10 nm to 45 nm and an interval between adjacent patterns W2 is approximately 10 nm to several μm. A structural body which forms the pattern 62 is, for example, approximately 50 nm to 5 μm in film thickness T. Further, the structural body may be, for example, approximately 5 to 500 in aspect ratio (a ratio of film thickness T to line width W1).

After a substrate W has been held by the spin chuck 5, the controller 3 controls the spin motor 10 (refer to FIG. 2), thereby starting rotation of the substrate W (Step S2 in FIG. 5A).

When rotation of a substrate W reaches a predetermined liquid processing speed (for example, approximately 800 rpm), the controller 3 executes a chemical liquid step (Step S3 in FIG. 5A) which supplies a chemical liquid to a front surface of the substrate W. Specifically, the controller 3 opens the chemical liquid valve 16. Thereby, the chemical liquid is supplied from the chemical liquid nozzle 14 to the front surface of the substrate W in a rotating state. The supplied chemical liquid spreads across an entire surface of the substrate W by a centrifugal force, and the substrate W is subjected to chemical liquid processing by using the chemical liquid. After elapse of a predetermined time from the start of discharge of the chemical liquid, the controller 3 closes the chemical liquid valve 16 to stop discharge of the chemical liquid from the chemical liquid nozzle 14. Thereby, the chemical liquid step (S3) is ended.

Next, the controller 3 executes a rinsing step (Step S4 in FIG. 5A) in which the chemical liquid on a substrate W is replaced by a rinse liquid to remove the chemical liquid from the substrate W. Specifically, the controller 3 opens the rinse liquid valve 19. Thereby, a rinse liquid is discharged from the rinse liquid nozzle 17 to a front surface of the substrate W in a rotating state. The discharged rinse liquid spreads across an entire surface of the substrate W by a centrifugal force. The chemical liquid adhered on the substrate W is washed away by the rinse liquid.

After elapse of a predetermined time from the start of supply of the rinse liquid, in a state that an entire region of the upper surface of the substrate W is covered with the rinse liquid, the controller 3 controls the spin motor 10 so as to reduce a rotating speed of the substrate W in a stepwise manner from a liquid processing speed to a puddle speed (low rotating speed of zero or approximately 40 rpm or lower, for example, approximately 10 rpm). Thereafter, the rotating speed of the substrate W is kept at the puddle speed. Thereby, as shown in FIG. 6A, a liquid film of water which covers the upper surface of the substrate W in its entirety is kept in a puddle state on the front surface of the substrate W.

Next, the rinse liquid on the substrate W is replaced by an organic solvent which is a low surface tension liquid lower in surface tension (Step S5 in FIG. 5A). Specifically, the controller 3 opens the organic solvent valve 22 to discharge a liquid-type organic solvent (for example, IPA) from the organic solvent nozzle 20 to the front surface of the substrate W. Thereby, the rinse liquid contained in the liquid film formed on the front surface of the substrate W is replaced by the organic solvent to form a liquid film of the organic solvent (in a puddle state on the front surface of the substrate W. After the rinse liquid on an upper surface of the substrate W has been replaced by the organic solvent, the controller 3 closes the organic solvent valve 22 to stop discharge of the organic solvent from the organic solvent nozzle 20.

Thereafter, the controller 3 executes a spin drying step (Step S6 in FIG. 5A). Specifically, the controller 3 accelerates a substrate W up to a predetermined spin dry speed (for example, approximately 1000 rpm) which is higher than a liquid processing speed, thereby rotating the substrate W at the spin dry speed. Thereby, a greater centrifugal force is applied to a liquid on the substrate W and the liquid adhered to the substrate W is spun off around the substrate W. In this way, the liquid is removed from the substrate W and the substrate W is dried.

After a predetermined time elapses after the start of the high speed rotation of the substrate W, the controller 3 controls the spin motor 10 so as to stop rotation of the substrate W by the spin chuck 5 (Step S7 in FIG. 5A).

Thereafter, the substrate W is carried out from an interior of the first chamber 4 (Step S8 in FIG. 5A). Specifically, the controller 3 allows the hand H1 of the substrate transfer robot CR to enter into the first chamber 4. Then, the controller 3 controls the hand H1 of the substrate transfer robot CR so as to hold the substrate W on the spin chuck 5. Thereafter, the controller 3 allows the hand H1 of the substrate transfer robot CR to retract from an interior of the chamber 4. Thereby, the substrate W after liquid processing is carried out from the first chamber 4.

In the spin drying step (S6) by the liquid processing unit 2A, collapse of the pattern 62 is considered to occur. In the spin drying step (S6), as shown in FIG. 6A, a liquid surface (an interface between air and a liquid) of an organic solvent is formed inside the pattern 62 and a surface tension of the organic solvent acts on a position at which the liquid surface is in contact with the pattern 62. At this time, the organic solvent which has entered into the pattern 62 is not uniform in liquid surface height H at various sites of the substrate W. Therefore, the organic solvent existing around the pattern 62 is considered to be varied in liquid surface height H at an entire periphery of a structural body which constitutes the pattern 62. Therefore, a surface tension (capillary force) of the liquid organic solvent that acts on the pattern 62 is not balanced with respect to an entire periphery of the pattern. The pattern 62 thus falls in a direction to which a greater surface tension acts. Thereby, as shown in FIG. 6B, the pattern 62 is collapsed.

On the other hand, the pattern 62 has elasticity and, in this case, even where the pattern 62 collapse occurs, the collapsed pattern 62a acts to some extent on the force to rise up (recover) due to the elasticity of the pattern itself.

A collapsed state is often retained, even if the pattern 62 has elasticity. The inventor of the present application has considered that, as one of the factors thereof, as shown in FIG. 6C, adjacent patterns 62 are collapsed, the leading end portions 62a thereof come into contact with each other, the leading end portions 62a in contact with each other are adhered by an adhered product 63 generated in association with liquid processing by the liquid processing unit 2A and, thereby, the pattern 62 is prevented from rising up. Then, it is considered that the pattern 62 is kept in a collapsed state for a long time and the collapsed state is memorized by the pattern 62 to keep the collapsed state. As described in the present preferred embodiment, where the silicon substrate 61 is used as a substrate, the adhered product 63 is considered to mainly contain a silicon oxide. The adhered product 63 may contain titanium oxide ($TiO_2$) in addition to, or in place of a silicon oxide.

Next, a description will be given of recovery processing (pattern recovering step) of a substrate W by the recovery processing unit 2B. When the recovery processing is executed by the recovery processing unit 2B, a substrate W which has been subjected to liquid processing by the liquid processing unit 2A is carried into the second chamber 28 (Step S9 in FIG. 5B). Before the substrate W is carried into the recovery processing unit 2B, the controller 3 controls the shutter driving unit 45 so as to move the shutter 44 to an opened position, by which the carry-in/carry-out port 43 is opened. Further, before the substrate W is carried into the recovery processing unit 2B, the controller 3 controls the lift pin lifting unit 38 to arrange the lift pin 36 at a position at which the leading end thereof is projected above the holding plate 31.

Specifically, the controller 3 allows the hand H1 (refer to FIG. 1) of the substrate transfer robot CR (refer to FIG. 1) which holds the substrate W to enter into the second chamber 28. Thereby, the substrate W is delivered to the substrate holding unit 32 in a state that the front surface thereof (surface to be processed) faces upward. The substrate W which has been carried into the second chamber 28 is placed on the lift pin 36 by the hand H1. Thereafter, the controller 3 controls the lift pin lifting unit 38 so as to lower the lift pin 36 toward a lower position. The lift pin 36 is lowered, by which the substrate W on the lift pin 36 is placed on the holding plate 31. Then, the substrate W is held on the holding plate 31 by a frictional force occurring between a lower surface of the substrate W and an upper surface of the holding plate 31.

After the substrate W has been placed on the lift pin 36, the controller 3 allows the hand H1 to retract from an interior of the second chamber 28. After the hand H1 has retracted from the interior of the second chamber 28, the controller 3 controls the shutter driving unit 45 so as to move the shutter 44 to a closed position. Thereby, the carry-in/carry-out port 43 is sealed by the shutter 44, and an interior of the second chamber 28 is made into a sealed space.

After the carry-in/carry-out port 43 has been sealed, the controller 3 controls the heater 42 so that heating of a substrate W can be started from the lower surface side (Step S10 in FIG. 5B), thereby elevating a temperature of the substrate W up to a predetermined temperature (for example, approximately 120° C.) higher than a boiling point (approximately 109° C.) of $H_2SiF_6$. Further, after the substrate W has been held on the holding plate 31, the controller 3 controls the spin motor 58 (refer to FIG. 3), thereby starting rotation of the substrate W.

When a temperature of the substrate W reaches a processing temperature (for example, approximately 120° C.) and also rotation of the substrate W reaches a recovery processing speed (for example, approximately 300 rpm), the controller 3 executes a hydrogen fluoride vapor supplying step (Step S11 in FIG. 5B). The hydrogen fluoride vapor supplying step (S11) is a step in which hydrogen fluoride vapor (HF vapor) is supplied to a front surface of the substrate W held on the holding plate 31. Specifically, the controller 3 opens the hydrogen fluoride vapor valve 47 and the exhaust valve 56, thereby introducing hydrogen fluoride vapor (HF vapor) from the hydrogen fluoride vapor introducing line 46 into the second chamber 28. Thereby, as shown in FIG. 7A, hydrogen fluoride vapor (HF vapor) is supplied to the front surface of the substrate W in its entirety. In this case, as shown in Formula (4), hydrogen fluoride reacts with a silicon oxide and is decomposed into $H_2SiF_6$ and water.

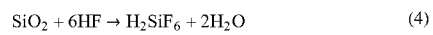

$$SiO_2 + 6HF \rightarrow H_2SiF_6 + 2H_2O \quad (4)$$

Where the adhered product 63 which adheres the leading end portions 62a of the collapsed patterns 62 together contains a silicon oxide, hydrogen fluoride vapor (HF vapor) supplied to the front surface of the substrate W reacts with the adhered product 63 that contains a silicon oxide and is decomposed to produce $H_2SiF_6$.

Further, in parallel with supply of hydrogen fluoride vapor (HF vapor), the controller 3 controls the heater 42 to heat the substrate W so as to be elevated in temperature higher than a boiling point (approximately 109° C.) of $H_2SiF_6$. Therefore, it is possible to evaporate residue of $H_2SiF_6$ occurring from a reaction of hydrogen fluoride contained in hydrogen fluoride vapor (HF vapor) with a silicon oxide ($SiO_2$, etc.) and remove the residue from the front surface of the substrate W.

By removing adhered product 63 is removed from the leading end portion 62a of the pattern 62, a force of the pattern 62 will rise up (recover) due to the elasticity of the pattern 62 acting on itself. Thereby, as shown in FIG. 7B, the collapsed pattern 62 rises up (recovers).

Further, in parallel with supply of hydrogen fluoride vapor (HF vapor), the substrate W is rotated to uniformly supply hydrogen fluoride vapor (HF vapor) to the upper surface of the substrate W in its entirety.

In the first substrate processing example, a flow rate of hydrogen fluoride vapor (HF vapor) supplied to the second chamber 28 is approximately 15 liters per minute including a carrier gas. At this time, a flow ratio of hydrogen fluoride vapor (HF vapor) to carrier gas is, for example, approximately 1:1. Time of supplying hydrogen fluoride vapor (HF vapor), that is, time of executing the hydrogen fluoride vapor supplying step (S11) is about one minute.

After elapse of a predetermined time from the start of supplying hydrogen fluoride vapor (HF vapor), the controller 3 closes the hydrogen fluoride vapor valve 47. Thereby, supply of hydrogen fluoride vapor (HF vapor) to the front surface of the substrate W is stopped.

Next, the controller 3 executes a water vapor supplying step (Step S12 in FIG. 5B) which supplies water vapor to a front surface of a substrate W. Specifically, the controller 3 opens the water vapor valve 49. Thereby, water vapor is introduced from the water vapor introducing line 48 into the second chamber 28, and the water vapor is supplied to the front surface of the substrate W. Further, in parallel with supply of the water vapor, the substrate W is rotated to uniformly supply water vapor to the upper surface of the substrate W in its entirety.

Water vapor favorably reacts with fluorine. Therefore, even where fluorine remains on a front surface of a substrate W after the water vapor supplying step (S12), water vapor is supplied to an upper surface of the substrate, thereby removing the fluorine remaining on the front surface of the substrate W.

Next, an atmosphere inside the second chamber 28 is replaced by an inert gas (Step S13 in FIG. 5B). Specifically, the controller 3 opens the inert gas valve 52. Thereby, an inert gas at an ordinary temperature is introduced from the inert gas introducing line 53 into the second chamber 28. As a result, an atmosphere inside the second chamber 28 is rapidly replaced by the inert gas introduced from the inert gas introducing line 53. Time of supplying the inert gas into the second chamber 28 (inert gas purge time) is about 30 seconds.

After the atmosphere inside the second chamber 28 has been replaced by an inert gas atmosphere, the controller 3 controls the heater 42 so as to stop heating of the substrate W (Step S14 in FIG. 5B). The controller 3 also closes the inert gas valve 52 and the exhaust valve 56.

Thereafter, the controller 3 controls the lift pin lifting unit 38 to raise the lift pin 36 so as to be positioned higher than the holding plate 31 that holds the substrate W. The lift pin 36 is raised, by which the substrate W which has been supported by the holding plate 31 is supported by the lift pin 36. Thereafter, the controller 3 controls the shutter driving unit 45 so as to arrange the shutter 44 at an opened position, thereby opening the carry-in/carry-out port 43. The substrate W supported by the lift pin 36 in this state is carried out from the second chamber 28 by the substrate transfer robot CR (Step S15 in FIG. 5B).

As described so far, according to the present preferred embodiment, hydrogen fluoride vapor (HF vapor) is supplied to a front surface of a substrate W in its entirety. A silicon oxide exists on the front surface of the substrate W. In this case, it is considered that the leading end portions of the collapsed patterns are adhered to each other by the adhered product 63 and the adhered product 63 contains a silicon oxide ($SiO_2$, etc.).

In this case, hydrogen fluoride contained in hydrogen fluoride vapor (HF vapor) reacts with a silicon oxide ($SiO_2$, etc.) and, therefore, hydrogen fluoride vapor (HF vapor) supplied to the front surface of the substrate W reacts with the adhered product 63 that contains a silicon oxide to undergo decomposition. Thereby, it is possible to remove the adhered product 63 from the leading end portion 62a of the pattern 62.

By removing the adhered product 63 from the leading end portion 62a of the pattern 62, a force of the pattern 62 will rise up (recover) due to the elasticity of the pattern 62 acting on itself. Thereby, it is possible to recover the collapsed pattern 62.

Further, a substrate W is heated in parallel with supply of hydrogen fluoride vapor (HF vapor) to the substrate W. Hydrogen fluoride contained in hydrogen fluoride vapor (HF vapor) reacts with a silicon oxide ($SiO_2$, etc.), by which residue of $H_2SiF_6$ may be generated. However, the substrate W is heated in parallel with supply of hydrogen fluoride vapor (HF vapor) to the substrate W. Thus, it is possible to evaporate the residue and remove them from the front surface of the substrate W.

After the hydrogen fluoride vapor supplying step (S11), water vapor supplying step (S12) is executed. Fluorine may remain on the front surface of the substrate W after the hydrogen fluoride vapor supplying step (S11) (that is, what-is-called F residue may occur). Since water vapor favorably reacts with fluorine, the fluorine remaining on the front surface of the substrate W is removed by water vapor supplied to the front surface of the substrate W. Thereby, it is possible to recover the collapsed pattern 62 without generating residual fluorine.

Figure 8:
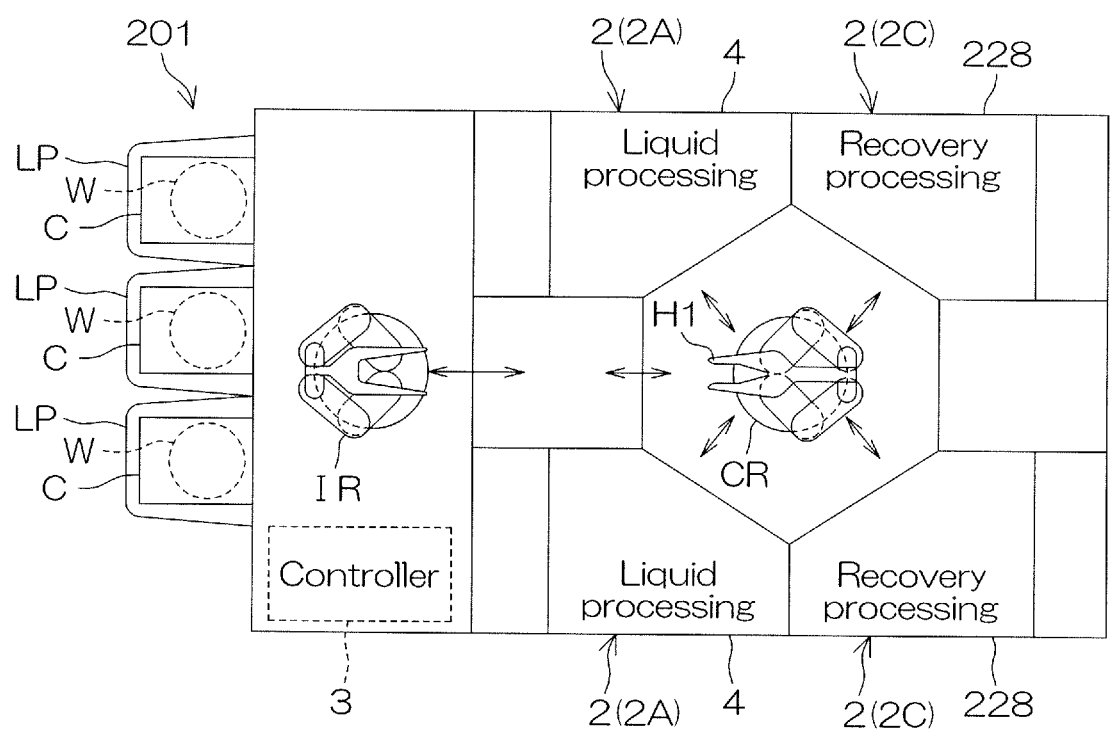
FIG. 8 is a plan view for describing a layout inside a substrate processing apparatus according to a second preferred embodiment of the present invention.

FIG. 8 is a plan view for describing a layout of an interior of a substrate processing apparatus 201 according to a second preferred embodiment of the present invention. FIG. is an illustrative sectional view for describing a configuration example of a recovery processing unit 2C provided in the substrate processing apparatus 201.

In the preferred embodiment shown in the second preferred embodiment, portions common to the first preferred embodiment are given the same reference numbers as with FIG. 1 to FIG. 7B, with a description thereof omitted. The substrate processing apparatus 201 is different from the substrate processing apparatus 1 in that the recovery processing unit 2C is provided instead of the recovery processing unit 2B.

The recovery processing unit 2C supplies a reactive gas to a front surface of a substrate W to recover a pattern. The recovery processing unit 2C uses, as the reactive gas, a gas that contains ozone gas (hereinafter, referred to as "ozone gas-containing gas").

Figure 9:
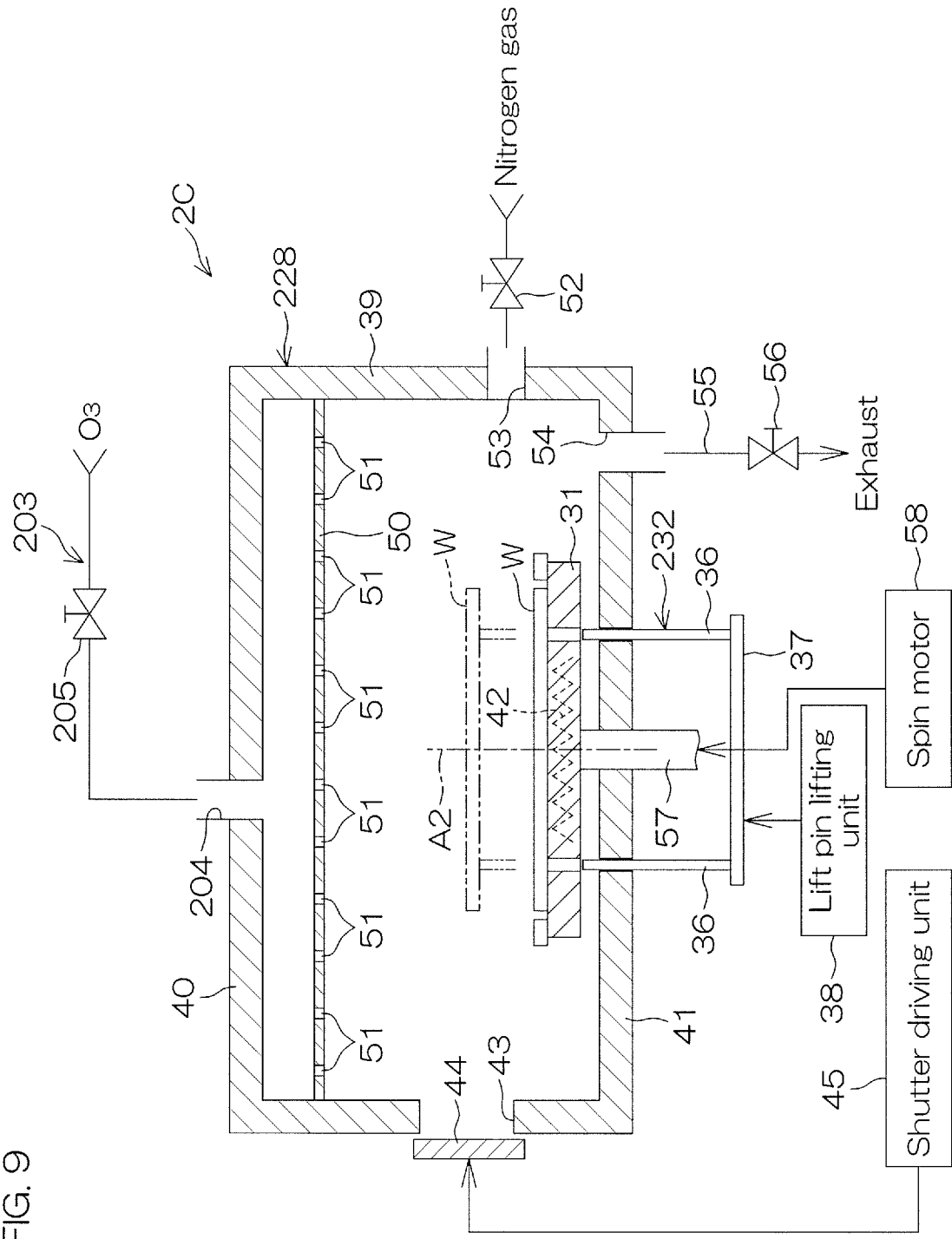
FIG. 9 is an illustrative sectional view for describing a configuration example of a recovery processing unit provided in the substrate processing apparatus.

As shown in FIG. 9, the recovery processing unit 2C includes, for example, a third chamber 228 which is formed in a tubular (cylindrical) shape, a substrate holding unit 232 which is housed in the third chamber 228 to include a holding plate 31, and an ozone gas supplying unit 203 (reactive gas supplying unit) which supplies an ozone gas-containing gas to an upper surface of the substrate W held by the holding plate 31.

The third chamber 228 according to the second preferred embodiment is similar in configuration to the second chamber 28 of the first preferred embodiment.

The substrate holding unit 232 according to the second preferred embodiment is similar in configuration to the substrate holding unit 32 of the first preferred embodiment.

As shown in FIG. 9, the ozone gas supplying unit 203 includes an ozone gas introducing line 204 which is disposed on an upper wall 40 of the third chamber 228. A gas that contains ozone gas (hereinafter, referred to as "ozone gas-containing gas") from an ozone gas supply source is supplied to the ozone gas introducing line 204. The ozone gas-containing gas ($O_3$) supplied to the ozone gas introducing line 204 may contain a carrier gas (for example, an inert gas such as nitrogen gas). The ozone gas introducing line 204 penetrates through the upper wall 40 to introduce the ozone gas-containing gas ($O_3$) into the third chamber 228. The ozone gas supplying unit 203 further includes an ozone gas valve 205 for opening and closing the ozone gas introducing line 204.

When the ozone gas valve 205 is opened, the ozone gas-containing gas ($O_3$) from the ozone gas introducing line 204 is supplied into the third chamber 228. The ozone gas-containing gas ($O_3$) from the ozone gas introducing line 204 is discharged by being dispersed from many discharge holes 51 of a rectifier 50, assuming a shower mode flowing at a substantially uniform flow rate in a plane parallel to an inner surface of the upper wall 40 inside the third chamber 228 and falling on a substrate W held by the holding plate 31.

Figure 10:
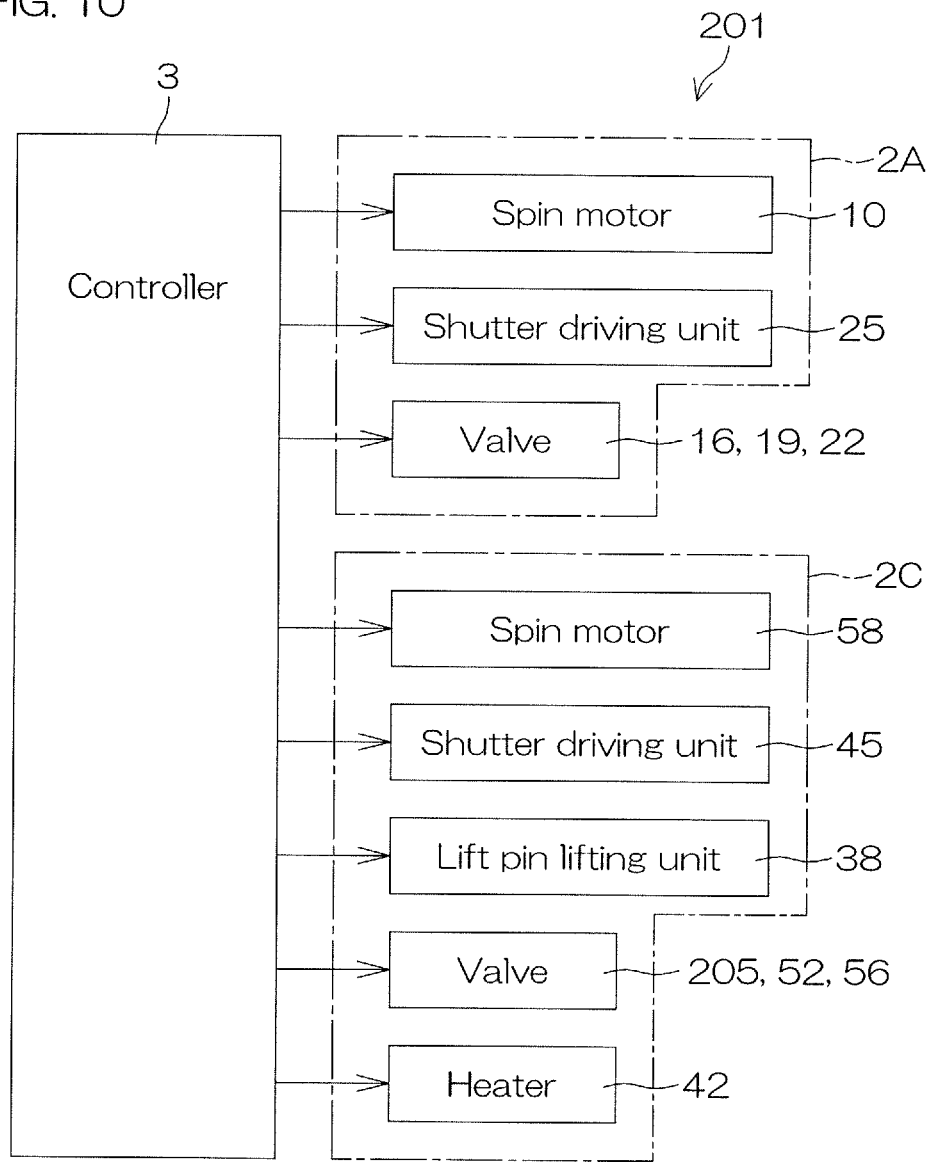
FIG. 10 is a block diagram for describing an electrical configuration of main portions of the substrate processing apparatus.

FIG. 10 is a block diagram for describing an electrical configuration of main portions of the substrate processing apparatus 201.

A controller 3 controls motions of a spin motor 10, a shutter driving unit 25, a spin motor 58, a lift pin lifting unit 38, a shutter driving unit 45, a heater 42, etc., according to predetermined programs. The controller 3 also opens and closes a chemical liquid valve 16, a rinse liquid valve 19, an organic solvent valve 22, an ozone gas valve 205, an inert gas valve 52, an exhaust valve 56, etc., according to predetermined programs.

Figure 11:
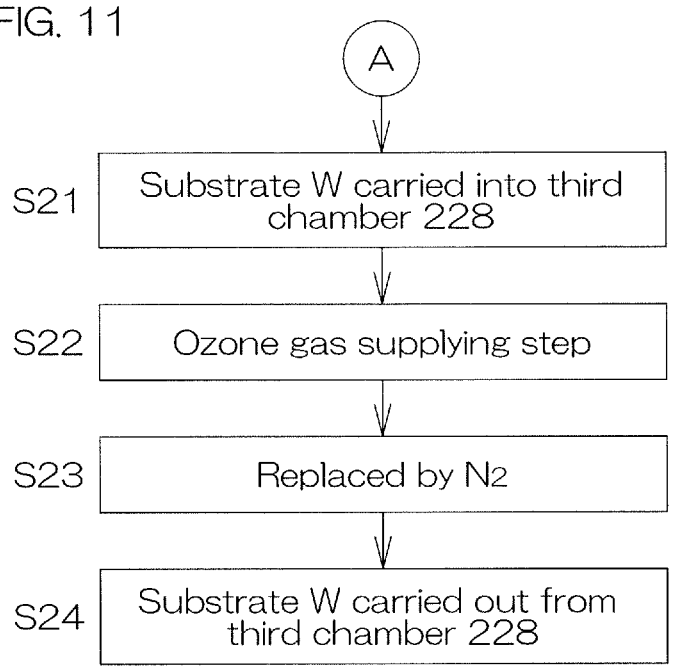
FIG. 11 is a flowchart for describing a second substrate processing example executed by the substrate processing apparatus.

FIG. 11 is a flowchart for describing a second substrate processing example executed by the substrate processing apparatus 201 (the liquid processing unit 2A and the recovery processing unit 2C).

The second substrate processing example is common to the first substrate processing example in terms of liquid processing given to a substrate W by the liquid processing unit 2A. That is, the second substrate processing example includes individual steps of Step S1 to Step S8 shown in FIG. 5A. In FIG. 11, only steps after Step S9 in FIG. 5A are described.

An organic substance may exist after liquid processing (liquid processing by the liquid processing unit 2A) depending on the type of a chemical liquid used in the chemical liquid step (S3 in FIG. 5A). In this case, an adhered product 63 (refer to FIG. 6C) is considered to mainly contain an organic substance.

Hereinafter, with reference to FIG. 8 to FIG. 11, a description will be given of recovery processing in the second substrate processing example. The recovery processing of the second substrate processing example is executed by the recovery processing unit 2C. When the recovery processing is executed by the recovery processing unit 2C, a substrate W after liquid processing by the liquid processing unit 2A is carried into the third chamber 228 (Step S21 in FIG. 11). A step of carrying the substrate W into the recovery processing unit 2C is a similar step that carries the substrate W (S9 in FIG. 5B) into the recovery processing unit 2B (refer to FIG. 2).

After the substrate W has been placed on a lift pin 36, the controller 3 allows a hand H1 to retract from an interior of the third chamber 228. After the hand H1 has retracted from the third chamber 228, the controller 3 controls the shutter driving unit 45 so as to move a shutter 44 to a closed position. Thereby, a carry-in/carry-out port 43 is sealed by the shutter 44 and an interior of the third chamber 228 is made into a sealed space.

After the carry-in/carry-out port 43 has been sealed, the controller 3 controls the heater 42 and starts to heat the substrate W from the lower surface side, thereby elevating a temperature of the substrate W up to a predetermined processing temperature (for example, approximately 120° C.). The controller 3 also controls the spin motor 58 (refer to FIG. 3) and starts to rotate the substrate W.

When a temperature of the substrate W reaches a processing temperature (for example, approximately 120° C.) and also rotation of the substrate W reaches a recovery processing speed (for example, approximately 300 rpm), the controller 3 executes an ozone gas supplying step (Step S22 in FIG. 11). The ozone gas supplying step (S22) is a step which supplies an ozone gas-containing gas ($O_3$) to the front surface of the substrate W held by a holding plate 31. Specifically, the controller 3 opens an ozone gas valve 205 and an exhaust valve 56 to introduce an ozone gas-containing gas ($O_3$) from an ozone gas introducing line 204 into the third chamber 228. Thereby, the ozone gas-containing gas ($O_3$) is supplied to the front surface of the substrate W in its entirety. In this case, the ozone gas contained in the ozone gas-containing gas ($O_3$) reacts with an organic substance to decompose the organic substance.

Where the adhered product 63 which adheres the leading end portions 62a (refer to FIG. 6B) of the collapsed patterns 62 (refer to FIG. 6B) together contains an organic substance, ozone gas contained in the ozone gas-containing gas ($O_3$) supplied to the front surface of the substrate W reacts with the adhered product 63 that contains an organic substance to undergo decomposition. Thereby, the adhered product 63 is removed from the leading end portion of the pattern 62.

By removing the adhered product 63 from the leading end portion 62a of the pattern 62, a force of the pattern 62 will rise up (recover) due to the elasticity of the pattern 62 acting on itself. Thereby, the collapsed pattern 62 will rise up (recover).

Further, in parallel with supply of an ozone gas-containing gas ($O_3$), the substrate W is rotated to uniformly supply the ozone gas-containing gas ($O_3$) to the upper surface of the substrate W in its entirety.

In the present preferred embodiment, a flow rate of the ozone gas-containing gas ($O_3$) supplied into the third chamber 228 is approximately 20 liters per minute including a carrier gas. At this time, a flow ratio of ozone gas to carrier gas is, for example, approximately 1:7. Time of supplying the ozone gas-containing gas ($O_3$), that is, time of executing the ozone gas supplying step (S22) is about three minutes.

After elapse of a predetermined time from the start of supplying the ozone gas-containing gas ($O_3$), the controller 3 closes the ozone gas valve 205. Thereby, supply of the ozone gas-containing gas ($O_3$) to the front surface of the substrate W is stopped.

Next, an atmosphere inside the third chamber 228 is replaced by an inert gas (Step S23 in FIG. 11). A step of replacement by an inert gas in the recovery processing unit 2C is a similar step of replacement by an inert gas (S13 in FIG. 5B) in the recovery processing unit 2B (refer to FIG. 2).

After an atmosphere inside the third chamber 228 has been replaced by an inert gas atmosphere, the controller 3 controls the heater 42 so as to stop heating of the substrate W. The controller 3 also closes the inert gas valve 52 and the exhaust valve 56.

Thereafter, the controller 3 controls the lift pin lifting unit 38 to raise the lift pin 36 so as to be positioned higher than the holding plate 31 that holds the substrate W. The lift pin 36 is raised, by which the substrate W which has been so far supported by the holding plate 31 is supported by the lift pin 36. Thereafter, the controller 3 controls the shutter driving unit 45 so as to arrange the shutter 44 at an opened position, thereby opening the carry-in/carry-out port 43. The substrate W supported by the lift pin 36 in this state is carried out from the third chamber 228 by the substrate transfer robot CR (Step S24 in FIG. 11).

As described so far, according to the present preferred embodiment, an ozone gas-containing gas ($O_3$) is supplied to the front surface of the substrate W. An organic substance exists on the front surface of the substrate W. In this case, the adhered product 63 adheres the leading end portions of the collapsed patterns together. The adhered product 63 is also considered to contain an organic substance.

In this case, ozone gas reacts with an organic substance and, therefore, ozone gas contained in an ozone gas-containing gas ($O_3$) supplied to the front surface of the substrate W reacts with the adhered product 63 that contains an organic substance to undergo decomposition. Thereby, the adhered product 63 is removed from the leading end portion 62a of the pattern 62.

By removing the adhered product 63 from the leading end portion 62a of the pattern 62, a force of the pattern 62 will rise up (recover) due to the elasticity of the pattern 62 acting on itself. Thereby, it is possible to recover the collapsed pattern 62.

Figure 12:
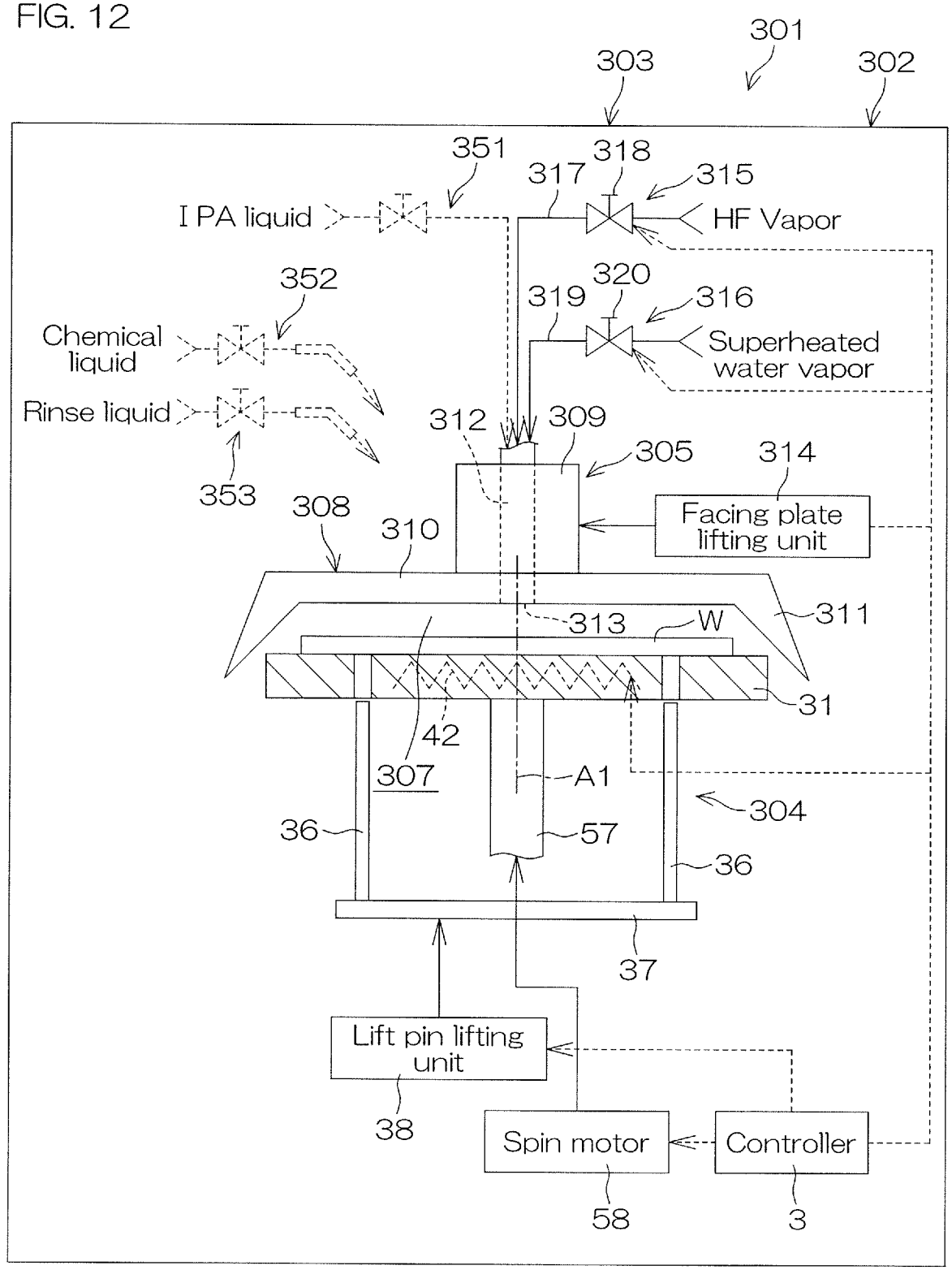
FIG. 12 is an illustrative sectional view for describing a configuration example of a recovery processing unit of a substrate processing apparatus according to a third preferred embodiment of the present invention.

FIG. 12 is an illustrative sectional view for describing a configuration example of a recovery processing unit 302 of a substrate processing apparatus 301 according to a third preferred embodiment of the present invention.

In the third preferred embodiment, portions corresponding to various portions shown in the first preferred embodiment are given the same reference numerals as those of FIG. 1 to FIG. 7B, with a description thereof omitted.

The substrate processing apparatus 301 is provided with the recovery processing unit 302 instead of the recovery processing unit 2B. It is different from the recovery processing unit 2B according to the first preferred embodiment in one aspect that a fourth chamber 303 is provided as a chamber that is not a sealed chamber. The recovery processing unit 302 includes the box-shaped fourth chamber 303, a substrate holding unit 304 which is housed inside the fourth chamber 303, and a facing member 305 which faces an upper surface of a substrate W held by a holding plate 31 of the substrate holding unit 304. The substrate holding unit 304 is similar in configuration to the substrate holding unit 32 (refer to FIG. 3) according to the first preferred embodiment.

In the present preferred embodiment, the facing member 305 comes close to the upper surface of the substrate W, thereby forming a half-sealed space 307 between the facing member 305 and the upper surface of the substrate W. At this half-sealed space 307, hydrogen fluoride vapor (HF vapor) is supplied to a front surface of the substrate W.

The facing member 305 includes an approximately disk-shaped facing plate 308. The facing plate 308 is arranged above the substrate holding unit 304. The facing plate 308 is supported in a horizontal posture by a supporting shaft 309 extending in an up and down direction. The facing plate 308 is formed in a disk shape having an outer diameter equal to or larger than the substrate W. A central axis of the facing plate 308 is arranged on a rotation axis A1.

The facing plate 308 includes a circular plate portion 310 arranged horizontally and a tubular portion 311 disposed along an outer circumferential edge of the circular plate portion 310. The tubular portion 311 may be formed in a circular truncated cone shape. Specifically, as shown in FIG. 12, the tubular portion 311 may be extended downward so as to be spread outside from an outer circumferential edge of the circular plate portion 310. Further, as shown in FIG. 12, the tubular portion 311 may be decreased in thickness as it moves closer to a lower end of the tubular portion 311.

The recovery processing unit 302 further includes a nozzle 312 which discharges a processing liquid. The nozzle 312 penetrates through the central portion of the facing plate 308 in the up and down direction. A discharge port 313 which is opened at a lower surface central portion of the facing plate 308 is formed at a lower end portion of the nozzle 312. The nozzle 312 is disposed so as to be raised and lowered in a vertical direction together with the facing plate 308.

The recovery processing unit 302 further includes a facing plate lifting unit 314 coupled to the facing plate 308 via the supporting shaft 309. The recovery processing unit 302 may be further provided with a shut-off plate rotation unit for rotating the facing plate 308 around the central axis of the facing plate 308. The facing plate lifting unit 314 raises and lowers the facing plate 308 between a proximity position (a position indicated in FIG. 12) at which the lower surface central portion of the facing plate 308 comes close to the upper surface of the substrate W and a retracted position (not shown) which is above the proximity position.

The recovery processing unit 302 further includes a hydrogen fluoride vapor supplying unit (reactive gas supplying unit) 315 which supplies hydrogen fluoride vapor (HF vapor) to the discharge port 313, and a water vapor supplying unit 316 which supplies water vapor to the discharge port 313. The hydrogen fluoride vapor supplying unit 315 and the water vapor supplying unit 316 are respectively used in place of the hydrogen fluoride vapor supplying unit 33 (refer to FIG. 3) and the water vapor supplying unit 34 (refer to FIG. 3) according to the first preferred embodiment.

The hydrogen fluoride vapor supplying unit 315 includes a hydrogen fluoride vapor line 317 which supplies hydrogen fluoride vapor (HF vapor) to the nozzle 312, and a hydrogen fluoride vapor valve 318 which opens and closes the hydrogen fluoride vapor line 317.

The water vapor supplying unit 316 includes a water vapor line 319 which supplies water vapor to the nozzle 312, and a water vapor valve 320 which opens and closes the water vapor line 319.

When the hydrogen fluoride vapor valve 318 is opened in a state that the water vapor line 319 is closed, hydrogen fluoride vapor is supplied to the nozzle 312 and the hydrogen fluoride vapor is discharged downward from the discharge port 313.

On the other hand, when the water vapor line 319 is opened in a state that the hydrogen fluoride vapor valve 318 is closed, water vapor is supplied to the nozzle 312 and the water vapor is discharged downward from the discharge port 313.

A controller 3 controls motions of a spin motor 58, a lift pin lifting unit 38, a heater 42, etc., according to predetermined programs. The controller 3 also opens and closes the hydrogen fluoride vapor valve 318, a water vapor valve 320, etc., according to predetermined programs.

In the recovery processing unit 302, processing similar to the first substrate processing example is executed to exhibit the same working effects as those described in the first substrate processing example. The recovery processing executed in the recovery processing unit 302 will be hereinafter described only for parts which are different from those of the recovery processing of the first substrate processing example.

When a temperature of the substrate W reaches a processing temperature (for example, approximately 120° C.) and also rotation of the substrate W reaches a recovery processing speed (for example, approximately 300 rpm), the controller 3 executes a hydrogen fluoride vapor supplying step (corresponding to S11 in FIG. 5B). Specifically, the controller 3 controls the facing plate lifting unit 314 so as to arrange the facing plate 308 at the proximity position. Thereby, the cylindrical half-sealed space 307 is formed between the facing member 305 and an upper surface of the substrate W. The controller 3 also opens the hydrogen fluoride vapor valve 318 and the exhaust valve 56. Thereby, hydrogen fluoride vapor (HF vapor) from the hydrogen fluoride vapor line 317 is introduced into the half-sealed space 307 to fill the half-sealed space 307. Thereby, hydrogen fluoride vapor (HF vapor) is supplied to a front surface of the substrate W in its entirety.

After elapse of a predetermined time from the start of supplying hydrogen fluoride vapor (HF vapor), the controller 3 closes the hydrogen fluoride vapor valve 318. Thereby, supply of hydrogen fluoride vapor (HF vapor) to the front surface of the substrate W is stopped.

Next, the controller 3 executes a water vapor supplying step (corresponding to S12 in FIG. 5B) which supplies water vapor to the front surface of the substrate W. Specifically, the controller 3 opens the water vapor valve 320. Thereby, water vapor from the water vapor line 319 is introduced into the half-sealed space 307 to fill the half-sealed space 307. Thereby, water vapor is supplied to the front surface of the substrate W in its entirety.

After elapse of a predetermined time from the start of discharging water vapor, the controller 3 controls the heater 42 so as to stop heating of the substrate W (corresponding to Step S14 in FIG. 5B). The controller 3 also closes the inert gas valve 52 and the exhaust valve 56. The controller 3 controls the facing plate lifting unit 314 so as to arrange the facing plate 308 at the retracted position.

Thereafter, the controller 3 controls the lift pin lifting unit 38 to raise the lift pin 36 so as to be positioned higher than the holding plate 31 that holds the substrate W. The lift pin 36 is raised, by which the substrate W which has been so far supported by the holding plate 31 is supported by the lift pin 36. The substrate W supported by the lift pin 36 in this state is carried out from the fourth chamber 303 by the substrate transfer robot CR (corresponding to Step S15 in FIG. 5B).

<First Recovery Test>

Next, a description will be given of a first recovery test for recovering a collapsed pattern. First, a first recovery test will be described.

A semiconductor substrate having a pattern with an aspect ratio of 16 was used as a sample of the first recovery test. Two samples (Sample 1 and Sample 2) to which an organic solvent was supplied (corresponding to S5 in FIG. 5A) were subjected to the spin drying step (corresponding to S6 in FIG. 5A). Thereafter, they were subjected to the hydrogen fluoride vapor supplying step (corresponding to S11 in FIG. 5B).

After execution of the spin drying step, collapse of patterns formed on each of the samples was found. The number of collapsed structural bodies on each of the samples was determined by analysis of images by SEM (scanning electron microscope). The number of the collapsed structural bodies can be determined by subtracting the number of structural bodies which remain to rise after the spin drying step from the number of structural bodies in a state that no pattern is collapsed.

Sample 1 and Sample 2 were subjected to the hydrogen fluoride vapor supplying step under the following conditions.

Sample 1: Hydrogen fluoride vapor (HF vapor) was supplied to the sample for one minute under the atmosphere, with the sample heated at 130° C.

Sample 2: Hydrogen fluoride vapor (HF vapor) was supplied to the sample for two minutes under the atmosphere, with the sample heated at 120° C.

The samples (Sample 1 and Sample 2) after execution of the hydrogen fluoride vapor supplying step were used to determine the number of structural bodies recovered from a collapsed state after recovery processing by making an analysis of images by SEM. The number of structural bodies recovered from a collapsed state can be determined by subtracting the number of structural bodies which remain to rise after the hydrogen fluoride vapor supplying step from the number of structural bodies which remain to rise after the spin drying step.

Next, a normalized recovery rate was calculated (the number of structural bodies recovered from a collapsed state after recovery processing/the number of structural bodies collapsed before the recovery processing (%)). The results are shown in FIG. 13.

Further, image views of Sample 1 by SEM before and after the hydrogen fluoride vapor supplying step are shown respectively in FIGS. 14A and 14B.

The results of the first recovery test have revealed that hydrogen fluoride vapor is supplied to a front surface of the sample (semiconductor substrate) to recover a collapsed pattern. The results have also revealed that a recovery rate of the pattern is increased with an increase in time of supplying hydrogen fluoride vapor.

<Second Recovery Test>

Next, a description will be given of a second recovery test.

A semiconductor substrate having a pattern with an aspect ratio of 16 was employed as a sample of the second recovery test. Four samples (Sample 3 to Sample 6) to which an organic solvent was supplied (corresponding to S5 in FIG. 5A) were subjected to the spin drying step (corresponding to S6 in FIG. 5A). Thereafter, they were also subjected to the hydrogen fluoride vapor supplying step (corresponding to S11 in FIG. 5B).

After execution of the spin drying step, collapse of patterns formed on each of the samples was found. The number of collapsed structural bodies on each of the samples was determined by making an analysis of images by SEM (scanning electron microscope).

Of the four samples (Sample 3 to Sample 6), Sample 3 and Sample 4 were relatively few in the number of collapsed patterns (of 17800 patterns in total, the number of collapsed patterns was less than 1000), while Sample 5 and Sample 6 were relatively large in the number of collapsed patterns.

Sample 3 to Sample 6 were subjected to the hydrogen fluoride vapor supplying step under the following conditions.

Sample 3 and Sample 5: hydrogen fluoride vapor was supplied for 10 minutes under the atmosphere.

Sample 4 and Sample 6: hydrogen fluoride vapor was supplied for 30 minutes under the atmosphere.

After execution of the hydrogen fluoride vapor supplying step, the samples (Sample 3 to Sample 6) were used to determine the number of collapsed patterns by making an analysis of images by SEM. FIG. 15 shows the number of collapsed patterns of each of the samples before and after the hydrogen fluoride vapor supplying step.

FIG. 15 has revealed that a collapsed pattern can be recovered by supplying hydrogen fluoride vapor to a front surface of the sample (semiconductor substrate). It has also revealed that a recovery rate of the pattern is increased with an increase in the number of collapsed patterns before the hydrogen fluoride vapor supplying step.

A description has so far given of three preferred embodiments of the present invention. The present invention can be implemented in yet other modes.

For example, in the third preferred embodiment, as indicated by a dotted line in FIG. 12, the recovery processing unit 302 may be further provided with an organic solvent supplying unit (processing liquid supplying unit) 351 which supplies an organic solvent to the discharge port 313. It may be also provided with a chemical liquid supplying unit (processing liquid supplying unit) 352 which supplies a chemical liquid to an upper surface of a substrate W held by the substrate holding unit 304 and a rinse liquid supplying unit (processing liquid supplying unit) 353 which supplies a rinse liquid to the upper surface of the substrate W held by the substrate holding unit 304. In this case, the first substrate processing example can be processed by a single processing unit to improve throughput due to reduction in time necessary for transferring a substrate W.

The substrate holding unit 232 according to the second preferred embodiment may not be provided with the heater 42 inside the holding plate 31. That is, in the second preferred embodiment, as the holding plate 31, there may be used a holding plate that will not function as a hot plate. In this case, a substrate W is not heated in the ozone gas supplying step (Step S22 in FIG. 11).

Further, in the first and the second preferred embodiments, the processing liquid supplying units (chemical liquid supplying unit 6, rinse liquid supplying unit 7 and organic solvent supplying unit 8) may be incorporated into the recovery processing units 2B, 2C so that a single processing unit can be used to execute the first substrate processing example or the second substrate processing example.

Further, in the first and the second preferred embodiments, replacement of an atmosphere inside the chamber 28, 228 by an inert gas may be started immediately after a substrate W has been carried into the chamber 28, 228. Still further, when the substrate W is carried in or carried out, the carry-in/carry-out port 23 is opened. However, an inert gas may be supplied into the chamber 28, 228 so that a gas (open air) outside the chamber 28, 228 is prevented from entering into the chamber 28, 228 in parallel with an opened state of the carry-in/carry-out port 23.

Further, in the first and the third preferred embodiments, heating of a substrate W may be ended before start of the water vapor supplying step (S12). That is, the water vapor supplying step (S12) and heating of the substrate W may be performed in parallel with each other.

Further, in the first and the third preferred embodiments (in the first substrate processing example), the water vapor supplying step (S12) may be omitted. In this case, in the first and the third preferred embodiments, it is possible to eliminate the water vapor supplying units 34 and 316.

Further, in the first to the third preferred embodiments, a description has been given of a case where a substrate W is rotated in parallel with the reactive gas supplying step (the hydrogen fluoride vapor supplying step and the ozone gas supplying step). However, while the substrate W is kept in a stationary state, the reactive gas supplying step (the hydrogen fluoride vapor supplying step (S12) and the ozone gas supplying step (S13)) may be performed.

Further, the first preferred embodiment may be combined with the second preferred embodiment. That is, one substrate processing apparatus 1 may be provided with both the recovery processing unit 2B (refer to FIG. 3) and the recovery processing unit 2C (refer to FIG. 9).

Further, the third preferred embodiment may be combined with the second preferred embodiment.

Further, in each of the embodiments so far described, a description has been given of a case where each of the substrate processing apparatuses 1, 201 and 301 is an apparatus for processing a disk-shaped substrate W. Each of the substrate processing apparatuses 1, 201 and 301 may be an apparatus for processing a polygonal substrate such as a glass substrate for a liquid crystal device.

While preferred embodiments of the present invention have been described in detail above, these are merely specific examples used to clarify the technical contents of the present invention, and the present invention should not be interpreted as being limited only to these specific examples, and the scope of the present invention shall be limited only by the appended claims.

The present application corresponds to Japanese Patent Application No. 2016-182122 filed in the Japan Patent Office on Sep. 16, 2016, and the entire disclosure of this application is incorporated herein by reference.

REFERENCE SIGNS LIST

1: Substrate processing apparatus
2A: Liquid processing unit
2B: Recovery processing unit
2C: Recovery processing unit
3: Controller
4: First chamber
5: Spin chuck (substrate holding unit, rotation unit)
6: Chemical liquid supplying unit (processing liquid supplying unit)
7: Rinse liquid supplying unit (processing liquid supplying unit)
8: Organic solvent supplying unit (processing liquid supplying unit)
28: Second chamber
32: Substrate holding unit
33: Hydrogen fluoride vapor supplying unit (reactive gas supplying unit)
34: Water vapor supplying unit
42: Heater
62: Pattern
201: Substrate processing apparatus
203: Ozone gas supplying unit (reactive gas supplying unit)
232: Substrate holding unit
301: Substrate processing apparatus
302: Recovery processing unit
304: Substrate holding unit
315: Hydrogen fluoride vapor supplying unit (reactive gas supplying unit)
316: Water vapor supplying unit
W: Substrate

What is claimed is:

1. A method for processing a substrate in which a pattern is formed on a front surface thereof, the method comprising:

a processing liquid supplying step which supplies a processing liquid, in a first chamber, to the front surface of the substrate on which the pattern has been formed, a spin drying step in which the substrate is rotated at a high speed and dried by spinning off the liquid after the processing liquid supplying step in the first chamber where collapse of the pattern occur, and a pattern recovering step in a second chamber, which is executed after the spin drying step, of recovering the collapsed pattern which is the pattern collapsed during the processing liquid supplying step and the spin drying step, wherein the pattern recovering step includes:

a substrate heating step for heating said substrate from a lower surface side of the substrate;

a reactive gas supplying step of supplying to the front surface of the substrate a reactive gas that can react with a product which is adhered to a leading end portion of the collapsed pattern during the processing liquid supplying step and the spin drying step;

a step of replacement of an atmosphere of the second chamber by an inert gas followed by stopping the heating step, wherein the reactive gas includes an ozone gas which reacts with the product to undergo decomposition, thereby recovering the collapsed pattern, and the product includes an organic substance which is different from a substance composing the pattern.

2. The substrate processing method according to claim 1, further comprising the substrate heating step which heats the substrate to evaporate residue from the decomposition.

* * * * *